United States Patent
Yamashita et al.

(10) Patent No.: US 7,719,841 B2
(45) Date of Patent: May 18, 2010

(54) SEMICONDUCTOR DEVICE AND DISPLAY APPARATUS

(75) Inventors: Kenji Yamashita, Kadoma (JP);
Hiroyuki Kageyama, Kadoma (JP);
Seiichi Moriyama, Kadoma (JP)

(73) Assignee: Panasonic Corporation, Osaka (JP)

( * ) Notice: Subject to any disclaimer, the term of this patent is extended or adjusted under 35 U.S.C. 154(b) by 144 days.

(21) Appl. No.: 11/933,695

(22) Filed: Nov. 1, 2007

(65) Prior Publication Data

US 2008/0198555 A1 Aug. 21, 2008

(30) Foreign Application Priority Data

Feb. 19, 2007 (JP) .............................. 2007-037259

(51) Int. Cl.
*H05K 7/20* (2006.01)
*F28F 7/00* (2006.01)

(52) U.S. Cl. ...................... 361/719; 361/704; 361/707; 361/712; 361/718; 165/80.2; 165/185; 313/46; 348/748

(58) Field of Classification Search ................ 361/704, 361/715, 719; 165/80.2, 185; 313/46, 582; 345/60, 905; 348/748; 349/58, 161
See application file for complete search history.

(56) References Cited

U.S. PATENT DOCUMENTS

| 6,534,722 B2 * | 3/2003 | Takaoka ..................... 174/254 |
| 6,657,620 B2 * | 12/2003 | Oishi et al. .................. 345/204 |
| 6,677,664 B2 * | 1/2004 | Inoue et al. .................. 257/668 |
| 6,703,702 B2 * | 3/2004 | Inoue et al. .................. 257/684 |
| 6,882,536 B2 * | 4/2005 | Deeney et al. ............... 361/719 |
| 7,414,851 B2 * | 8/2008 | You ........................... 361/719 |
| 7,436,654 B2 * | 10/2008 | Cho ....................... 361/679.27 |
| 7,535,173 B2 * | 5/2009 | Kim .......................... 313/582 |
| 7,582,959 B2 * | 9/2009 | Fukusako ................... 257/678 |
| 2003/0179549 A1 | 9/2003 | Zhong et al. |
| 2003/0209809 A1 | 11/2003 | Lasky et al. |
| 2006/0198106 A1 * | 9/2006 | You ........................... 361/702 |
| 2007/0188692 A1 * | 8/2007 | Fukusako et al. ........... 349/150 |
| 2009/0008771 A1 * | 1/2009 | Torii et al. .................. 257/713 |
| 2009/0097209 A1 * | 4/2009 | Fukusako et al. ........... 361/719 |

FOREIGN PATENT DOCUMENTS

JP 2003-115568 4/2003
JP 2003202811 A * 7/2003

* cited by examiner

*Primary Examiner*—Jayprakash N Gandhi
*Assistant Examiner*—Robert J Hoffberg
(74) *Attorney, Agent, or Firm*—Steptoe & Johnson LLP

(57) ABSTRACT

The present invention provides a semiconductor device comprising a semiconductor element, a single-layer wiring board on which the semiconductor element is mounted, a connector section located at an end of the single-layer wiring board, a thermally and electrically conductive radiator plate, a relay electrode section formed on the single-layer wiring board, and a connecting member that electrically connects the radiator plate and the relay electrode section together. The single-layer wiring board is structured so that a power supply potential and/or a ground potential received by the connector section is transmitted through a path comprising the radiator plate, the relay electrode section, and the connecting member to the semiconductor element.

21 Claims, 13 Drawing Sheets

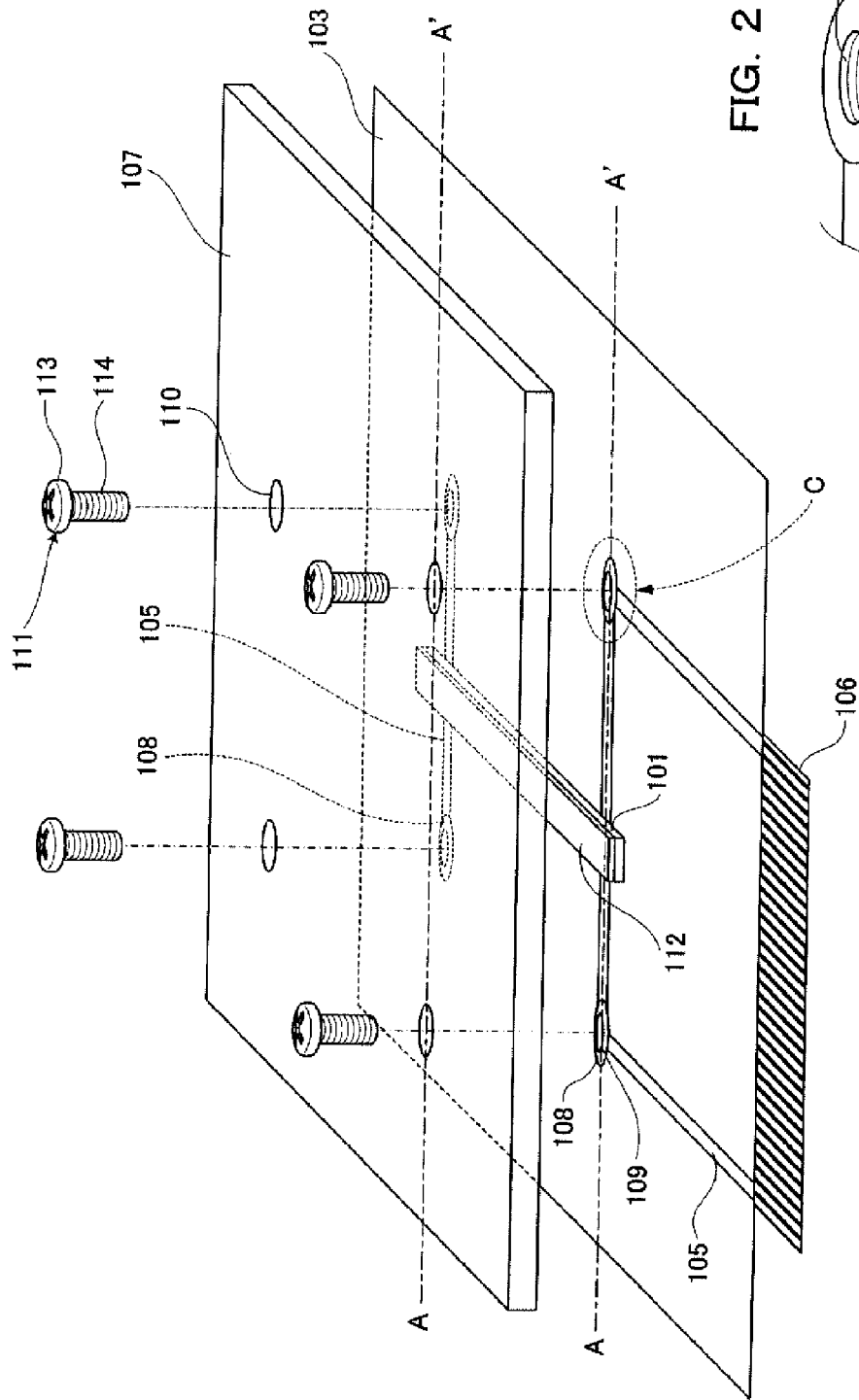
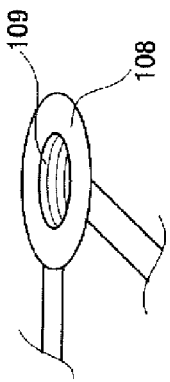

SEMICONDUCTOR DEVICE AND DISPLAY APPARATUS

The present application claims priority to Japanese Patent Application No. 2007-037259, filed Feb. 19, 2007, which application is incorporated herein by reference in its entirety.

FIELD OF THE INVENTION

The present invention relates to a semiconductor device used as a driver IC in a flat panel display such as a PDP (Plasma Display Panel), as well as a display apparatus using the semiconductor device.

BACKGROUND OF THE INVENTION

A conventional semiconductor device used in a flat panel display as a driver IC will be described below taking, as an example, a semiconductor device driving a PDP, which is attracting much attention as a thin high-definition display panel with a large screen.

The PDP comprises a plurality of discharge cells arranged in a matrix, as pixels. The PDP comprising the discharge cells as the pixels displays images utilizing the emission and non-emission of light during discharge from the discharge cells. In a general AC PDP, the plurality of discharge cells (pixels), arranged in a matrix, are composed of a plurality of scan sustain electrodes and a plurality of data electrodes arranged in a direction orthogonal to the scan sustain electrodes. Each of the scan sustain electrodes is made of a scan electrode and a sustain electrode which are arranged adjacent to each other. The scan electrodes and sustain electrodes constituting the plurality of scan sustain electrodes are alternately arranged adjacent to one another.

The semiconductor device used in the AC PDP as a driver IC is mounted on a wiring board and serves as a driver module. The semiconductor device, serving as the driver module, is connected to panel driving electrodes. The semiconductor device connected to the panel driving electrodes allows the PDP to perform an image display operation described below.

The PDP first performs a reset operation to initialize all the discharge cells to the same state. The PDP then applies a scan pulse to the scan electrodes, and in synchronism with the application of the scan pulse, applies a load driving signal that is a data signal for a display state or a non-display state, to the data electrodes. Wall charges are accumulated in the discharge cells for which the display state is selected by the load driving signal.

After applying the scan pulse to the scan electrodes and applying the load driving signal to the data electrodes for all the scan electrodes, the PDP applies a sustain pulse to the scan electrodes and the sustain electrodes so as to alternate voltage polarities. As a result, in discharge cells in which wall charges have been accumulated, the sustain pulse voltage is superimposed onto the wall charges, so that the resulting voltage exceeds a discharge threshold. This causes discharge cells for which the display state is selected by the load driving signal to emit light. In discharge cells for which the non-display state is selected by the load driving signal, the voltage does not exceed the discharge threshold. Consequently, these discharge cells do not emit light. Thus, the display on the entire screen is achieved by the light emission and non-emission of the discharge cells.

The PDP repeats the above operation to display images.

With the increased size of the panel screen and the increased definition and luminance of the panel, in recent years, the semiconductor device used in the flat panel display as a driver IC has needed to deal with multi-pin outputs, high voltage driving, and an improved driving ability.

The improved driving ability and the multi-pun outputs increase driving loads on the semiconductor device and thus the amount of heat generated by the semiconductor device during operation. To solve this problem, a semiconductor device has been proposed in which a flip chip mounted on a wiring board is protected by a peripheral wall surrounding the flip chip and in which an electrically and thermally conductive member is contacted with the flip chip through an opening in the peripheral wall, with a chassis connected to the wiring board with the flip chip mounted thereon (Japanese Patent Laid-Open No. 2003-115568). This configuration can improve heat dissipation. Moreover, a ground potential can be enhanced by setting the chassis connected to the wiring board with the flip chip mounted thereon, at the ground potential.

Further, with the improved driving ability and the multi-pin outputs, the increased length of the flip chip associated with the multi-pin outputs disadvantageously increases the length of power supply wiring inside the flip chip and thus impedance. Furthermore, voltage disadvantageously drops at the longitudinally opposite ends of the inside of the flip chip. To solve this problem, the conventional semiconductor device needs to ensure an appropriate wiring width to reduce wiring resistance and thus needs to increase chip size. Moreover, it is necessary to use an expensive multilayer wiring board instead of the conventional inexpensive single layer wiring board.

However, since the panel with the larger screen uses several to several tens of driver ICs, the increase in chip size and the multiple layers in the wiring board significantly increase costs. Further, when the flip chip is mounted on the multilayer wiring board, heat dissipation efficiency may decrease compared to that in the prior art.

DISCLOSURE OF THE INVENTION

The present invention solves the above problems. An object of the present invention is to provide a semiconductor device used as a driver IC in a flat panel display such as a PDP and which can be implemented using a single-layer wiring board, the semiconductor device inhibiting an increase in impedance caused by long power supply wiring inside a flip chip associated with multi-pin outputs as well as a voltage drop at the longitudinally opposite ends of the inside of the flip chip, while enabling heat dissipation, power supply potential, and ground potential to be enhanced in spite of increased driving loads resulting from the increased size of the screen. Another object of the present invention is to provide a display apparatus using the semiconductor device.

To accomplish the object, a semiconductor device according to the present invention includes:

a single-layer wiring board;

a semiconductor element mounted on the single-layer wiring board;

an element electrode provided on the semiconductor element;

a board electrode provided on the single-layer wiring board and electrically connected to the element electrode;

a connector section provided at an end of the single-layer wiring board to receive an external signal containing a first potential and a second potential to drive the semiconductor element;

at least one electrically and thermally conductive radiator plate used to transmit the first potential and/or the second potential;

at least one relay electrode section provided on the single-layer wiring board; and at least one connecting member located between the radiator plate and the relay electrode section to electrically connect the radiator plate and the relay electrode section together, the first potential and/or the second potential received by the connector section being transmitted through a path including the radiator plate, the relay electrode section, and the connecting member, via the board electrode to the element electrode on the semiconductor element.

Furthermore, the first potential is one of a power supply potential and a ground potential of the semiconductor element, and the second potential is the other of the power supply potential and the ground potential of the semiconductor element.

Furthermore, the connecting member includes a head portion having a flange portion, and a body portion, and the connecting member is located so that the head portion is exposed from one surface of the radiator plate and so that a part of the body portion projects from the other surface of the radiator plate and connects to the relay electrode section, and an electrically conductive connection holding member is provided between the flange portion of the connecting member and the one surface of the radiator plate to support the flange portion.

Furthermore, the external shape of the semiconductor element has two short sides and two long sides, and one of the short sides is located closer to the connector section, while the other of the short sides is located farther from the connector section.

Furthermore, the at least one element electrode to which the first potential and/or the second potential is transmitted through the radiator plate is provided in the vicinity of an end of the semiconductor element located farthest from the connector section.

Furthermore, the at least one relay electrode section is provided in the connector section or in the vicinity of the connector section and connected to the connector section.

Furthermore, the radiator plate is located over the semiconductor element and opposite the single-layer wiring board across the semiconductor element.

Furthermore, the radiator plate includes a first upper radiator plate and a second upper radiator plate arranged over the semiconductor element and opposite the single-layer wiring board across the semiconductor element,
a plurality of the relay electrode sections are provided for each of the first upper radiator plate and the second upper radiator plate,
one of the first potential and the second potential is transmitted to the first upper radiator plate via the connecting member, and
the other of the first potential and the second potential is transmitted to the second upper radiator plate via the connecting member.

Furthermore, the radiator plate includes an upper radiator plate provided over the semiconductor element and opposite the single-layer wiring board across the semiconductor element and a lower radiator plate provided under the single-layer wiring board and opposite the semiconductor element across the single-layer wiring board.
a plurality of the relay electrode sections are provided for the upper radiator plate, and the at least one relay electrode section is provided for the lower radiator plate,
one of the first potential and the second potential is transmitted to the upper radiator plate via the connecting member, and
the other of the first potential and the second potential is transmitted to the lower radiator plate via the connecting member.

Furthermore, one of a tip portion and a tip surface of the connecting member which is located closer to the single-layer wiring board is electrically insulated.

Furthermore, the radiator plate is located under the single-layer wiring board and opposite the semiconductor element across the single-layer wiring board.

Furthermore, the radiator plate includes a first lower radiator plate and a second lower radiator plate arranged under the single-layer wiring board and opposite the semiconductor element across the single-layer wiring board,
the at least one relay electrode section is provided for each of the first lower radiator plate and the second lower radiator plate,
one of the first potential and the second potential is transmitted to the first lower radiator plate via the connecting member, and
the other of the first potential and the second potential is transmitted to the second lower radiator plate via the connecting member.

Furthermore, the radiator plate is provided over the semiconductor element and opposite the single-layer wiring board across the semiconductor element and includes three layers, a lower radiator plate, an insulating layer, and an upper radiator plate,
a plurality of through-holes into each of which the connecting member connected to the upper radiator plate is inserted are formed in each of the lower radiator plate and the insulating layer,
a plurality of the relay electrode sections are provided for each of the upper radiator plate and the lower radiator plate,
one of the first potential and the second potential is transmitted to the upper radiator plate via the connecting member, and
the other of the first potential and the second potential is transmitted to the lower radiator plate via the connecting member.

Furthermore, the connecting member is inserted into the through-hole so as not to contact the lower radiator plate.

Furthermore, each of the through-holes has a size varying between a portion corresponding to the lower radiator plate and a portion corresponding to the insulating layer.

Furthermore, the radiator plate is provided under the single-layer wiring board and opposite the semiconductor element across the single-layer wiring board and includes three layers, a lower radiator plate, an insulating layer, and an upper radiator plate,
a plurality of through-holes into each of which the connecting member connected to the lower radiator plate is inserted are formed in each of the upper radiator plate and the insulating layer,
the at least one relay electrode section is provided for the upper radiator plate, and a plurality of the relay electrode sections are provided for the lower radiator plate,
one of the first potential and the second potential is transmitted to the upper radiator plate via the connecting member, and
the other of the first potential and the second potential is transmitted to the lower radiator plate via the connecting member.

Furthermore, the connecting member is inserted into the through-hole so as not to contact the upper radiator plate.

Furthermore, each of the through-holes has a size varying between a portion corresponding to the upper radiator plate and a portion corresponding to the insulating layer.

The semiconductor device according to the present invention further includes an electrically conductive support plate that supports the single-layer wiring board with the semiconductor element mounted thereon, from below the single-layer wiring board, the connecting member also being located between the radiator plate and the support plate to connect electrically the radiator plate and support plate together, one of the first potential and the second potential being transmitted to the support plate via the connecting member.

A display apparatus according to the present invention includes:

a plurality of the semiconductor devices;

a display panel in which pixels are arranged in a matrix;

an image processing section that generates an external signal containing a first potential and a second potential required to drive a semiconductor element contained in each of the semiconductor devices; and a common wiring board that transmits the external signal generated by the image processing section, each of the semiconductor devices being connected to the common wiring board via a connector section provided on the semiconductor device to receive the external signal to drive a corresponding pixel column block for display.

The display apparatus according to the present invention further includes:

at least one electrically and thermally conductive radiator plate located over and/or under the common wiring board and used to transmit the first potential and/or the second potential;

a plurality of relay electrode sections provided on the common wiring board so as to connect electrically to a part of wiring on the common wiring board through which the first potential and/or the second potential is transmitted, and a plurality of electrically conductive connecting members arranged between the radiator plate provided for the common wiring board and the relay electrode sections provided on the common wiring board to electrically connect the radiator plate provided for the common wiring board to the relay electrode sections provided on the common wiring board.

The present invention allows the semiconductor device used as a driver IC in the flat panel display such as a PDP to be implemented using a single-layer wiring board. The present invention further makes it possible to inhibit an increase in impedance caused by long power supply wiring inside the semiconductor element associated with multi-pin outputs as well as a voltage drop at the longitudinally opposite ends of the inside of the semiconductor device. The present invention also enables the heat dissipation, power supply potential, and ground potential to be enhanced in spite of increased driving loads resulting from the increased size of the screen.

The semiconductor device according to the present invention is useful as, for example, a driver IC for a PDP. The present invention is also applicable to an elongate semiconductor device requiring an improved driving ability and multi-pin outputs, such as a driver IC driving a flat panel display with a larger screen and an increased definition.

BRIEF DESCRIPTION OF THE DRAWINGS

FIG. 1 is an exploded perspective view showing a schematic configuration of a semiconductor device according to Embodiment 1 of the present invention;

FIG. 2 is an enlarged diagram of a portion denoted by reference character C in FIG. 1;

DESCRIPTION OF THE EMBODIMENTS

Embodiment 1

Figure 3:
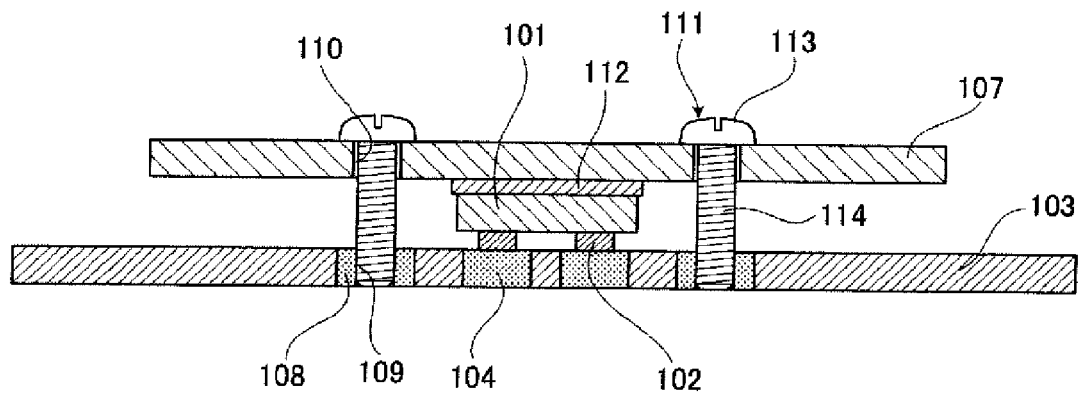
FIG. 3 is a sectional view showing the schematic configuration of the semiconductor device according to Embodiment 1 of the present invention.
Figure 4:
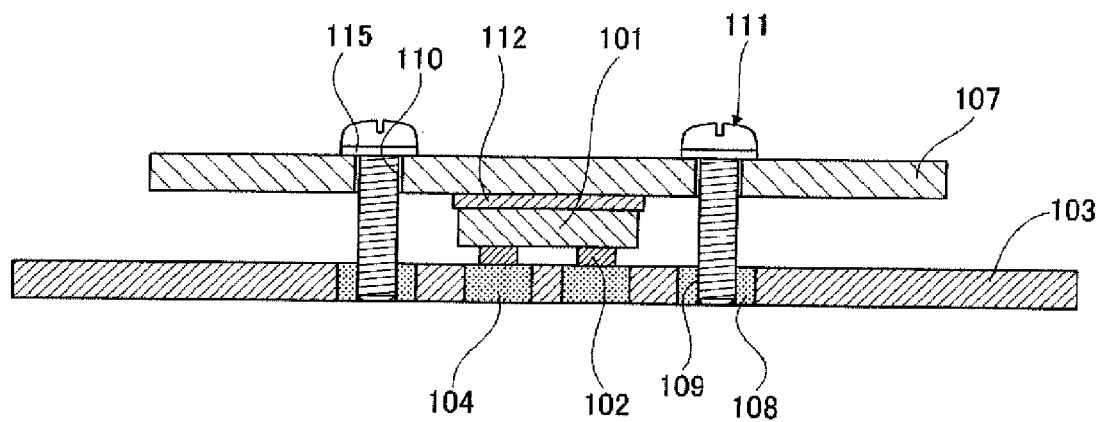
FIG. 4 is a sectional view showing another example of the schematic configuration of the semiconductor device according to Embodiment 1 of the present invention.

Embodiment 1 of the present invention will be described below with reference to the drawings. FIG. 1 is an exploded perspective view showing a schematic configuration of a semiconductor device according to Embodiment 1 of the present invention. FIG. 2 is an enlarged diagram showing a portion shown by reference character C in FIG. 1. FIG. 3 is a sectional view taken along line A-A' in FIG. 1, showing a schematic configuration of the semiconductor device according to Embodiment 1 of the present invention. FIG. 4 is a sectional view showing another example of the schematic configuration of the semiconductor device according to Embodiment 1 of the present invention. In FIGS. 3 and 4, wiring on a single-layer wiring board is omitted.

In FIGS. 1 to 4, reference numerals 101 and 102 denote a flip chip (semiconductor element) and a bump electrode (element electrode) on the flip chip, respectively. Reference numerals 103 and 104 denote a single-layer wiring board and a board electrode in the single-layer wiring board, respectively. Reference numerals 105 and 106 denote a power supply wiring on the single-layer wiring board and a connector section, respectively. Reference numerals 107 and 108 denote an upper radiator plate and a relay electrode area (relay electrode section) on the single-layer wiring board, respectively. Reference numerals 109 and 110 denote a board connecting hole in the single-layer wiring board and a radiator plate connecting hole in the upper radiator plate, respectively. Reference numerals 111 and 112 denote a connecting member and an insulating layer, respectively. Reference numerals 113 and 114 denote a head portion of the connecting member and a body portion of the connecting member, respectively. Reference numeral 115 denotes a washer.

As shown in FIGS. 1 and 3, the semiconductor device is made of a flip chip 101 and a single-layer wiring board 103 on which the flip chip 101 is mounted. The bump electrode 102, provided on the flip chip 101 mounted on the single-layer wiring board 103, is joined to the board electrode 104, provided in the single-layer wiring board 103. The joined bump electrode 102 and board electrode 104 are electrically connected together.

A connector section (I/F) 106 is provided at an end of the single-layer wiring board 103 and comprises a terminal group that receives an external signal containing a power supply potential (first potential) and a ground potential (second potential) required to drive the flip chip 101.

A thermally conductive insulating layer 112 is provided on a top surface of the flip chip 101 and opposite the single-layer wiring board 103 across the flip chip 101. An electrically and thermally conductive upper radiator plate 107 is provided on a top surface of the insulating layer 112 in surface contact with the top surface. The upper radiator plate 107 is used not only to dissipate heat from the semiconductor device but also to transmit one of a power supply potential and a ground potential.

Each relay electrode area 108 is formed in the middle of the power supply wire 105 on the single-layer wiring board 103 to connect electrically to the power supply wire 105. As shown in FIG. 2, each board connecting hole 109 is formed in the corresponding relay electrode area 108. The upper radiator plate 107 has the radiator plate connecting holes 110 formed at positions corresponding to the board connecting holes 109.

The electrically conductive connecting members 111, located between the upper radiator plate 107 and the corresponding relay electrode area 108, electrically connect the upper radiator plate 107 and the relay electrode area 108 together. Specifically, each of the connecting members 111 comprises the head portion 113 having a flange portion, and the body portion 114. The connecting member 111 is inserted into the corresponding radiator plate connecting hole 110 from above the upper radiator plate 107. When the connecting member 111 is inserted into the radiator plate connecting hole 110, the head portion 113 is exposed from a top surface (one surface) of the upper radiator plate 107. A part of the body portion 114 projects from a bottom surface (other surface) of the upper radiator plate 107 into the board connecting hole 109. The thus located connecting member 111 electrically connects the relay electrode area 108 and the upper radiator plate 107 together. Here, the board connecting hole 109 has an internal thread, and a part of the body portion 114 of the connecting member 111 is threadably engaged with the board connecting hole 109. The body portion 114 of the connecting member 111 may be electrically connected to an inner surface of the radiator plate connecting hole 110. The body portion 114 of the connecting member 111 may not be electrically connected to the inner surface of the radiator plate connecting hole 110 provided that the head portion 113 is electrically connected to the top surface of the upper radiator plate 107.

As shown in FIG. 4, the washer 115 (connection holding member)/exerting a repulsive force and having electrical conductivity, may be provided between the flange portion of the connecting member 111 and the top surface of the upper radiator plate 107 to support the flange portion. Thus, by placing the washer 115 in a portion where the connecting member 111 is in contact with the upper radiator plate 107, it is possible to ensure the electric connection between the upper radiator plate 107 and the connecting member 111 even if, for example, temporary deformation such as warpage of the upper radiator plate 107 and single-layer wiring board 103 is caused by thermal expansion or the like. This makes it possible to prevent the possible electric disconnection at the interface between the connecting member 111 and the upper radiator plate 107. For example, an electrically conductive spacer exerting a repulsive force may be used as a connection holding member placed in the portion where the connecting member 111 is in contact with the upper radiator plate 107.

The power supply wiring on the single-layer wiring board 103, connected directly to the connector section 106, transmits the external signal received by the connector section 106 to the bump electrode 102 on the flip chip 101 via the board electrode 104.

As described above, the relay electrode area 108 is electrically connected to a part of the power supply wiring connected directly to the connector section 106, that is, a first power supply wire 105 through which one of the power supply potential and the ground potential is transmitted. One of the power supply potential and ground potential, transmitted through the first power supply wire 105 electrically connected to the relay electrode area 108 is also transmitted to the upper radiator plate 107 via the connecting member 111. One of the power supply potential and ground potential transmitted to the upper radiator plate 107 is transmitted via the other connecting member 111 to a second power supply wire 105 not directly connected to the connector section 106 on the single-layer wiring board 103. The second power supply wire 105 is connected to the board electrode 104 joined to another bump electrode 102 on the flip chip 101. The flip chip 101 is supplied with the power supply potential or the ground potential via the upper radiator plate 107.

Thus, in the single-layer wiring board 103, one of the power supply potential and ground potential received by the connector section 106 is transmitted through a path made of the upper radiator plate 107, the relay electrode area 108, and the connecting member 111, via the board electrode 104 to the bump electrode 102 on the flip chip 101.

FIG. 1 shows an example in which the four relay electrode areas 108 are formed. However, the present invention is not limited to this, but at least two relay electrode areas 108 have only to be formed.

As described above, in the semiconductor device, the upper radiator plate 107 is electrically connected to the single-layer wiring board 103 and the flip chip 101 by the connecting members 111. Consequently, the power supply wire 105 on the single-layer wiring board 103 can be used to supply one of the power supply potential and ground potential applied to the connector section 106 to the flip chip 101, mounted on the single-layer wiring board 103, and to a remote end of the flip chip 101 via the upper radiator plate 107. This makes it possible to enhance one of the power supply potential and the ground potential.

The shape of the connecting member 111 is not limited to the one in which the connecting member 111 comprises the head portion 113, having the flange portion, and the body portion 114, with a part of the body portion 114 threadably engaged with the corresponding board connecting hole 109 (using the internal thread). The connecting member 111 has only to be able to electrically connect the relay electrode area 108 and the upper radiator plate 107 together. Therefore, although the connecting holes are formed in the upper radiator plate 107 and the single-layer wiring board 103 (radiator plate connecting holes 110 and board connecting holes 109), the present invention is not limited to the structure in which the connecting members 111 are inserted into the holes, provided that the connecting members 111 can be electrically connected to the upper radiator plate 107 and the single-layer wiring board 103.

In the example shown in FIG. 1, the external shape of the flip chip 101 is made of two short sides and two long sides. The flip chip 101 is vertically placed (the flip chip 101 is placed so that the long sides of the flip chip 101 extend in the vertical direction as viewed from the connector section 106) so that one of the short sides is located closer to the connector section 106, while the other short side is located away from the connector section 106. However, the present invention is not limited to this. The flip chip 101 may be horizontally placed (the flip chip 101 is placed so that the long sides of the flip chip 101 extend in the horizontal direction as viewed from the connector section 106) so that one of the long sides is located closer to the connector section 106, while the other long side is located away from the connector section 106. In the above described example, the semiconductor element is the flip chip. However, the present invention is not limited to this, but the semiconductor element may be electrically connected to the single-layer wiring board by, for example, bonding wire.

Figure 5:
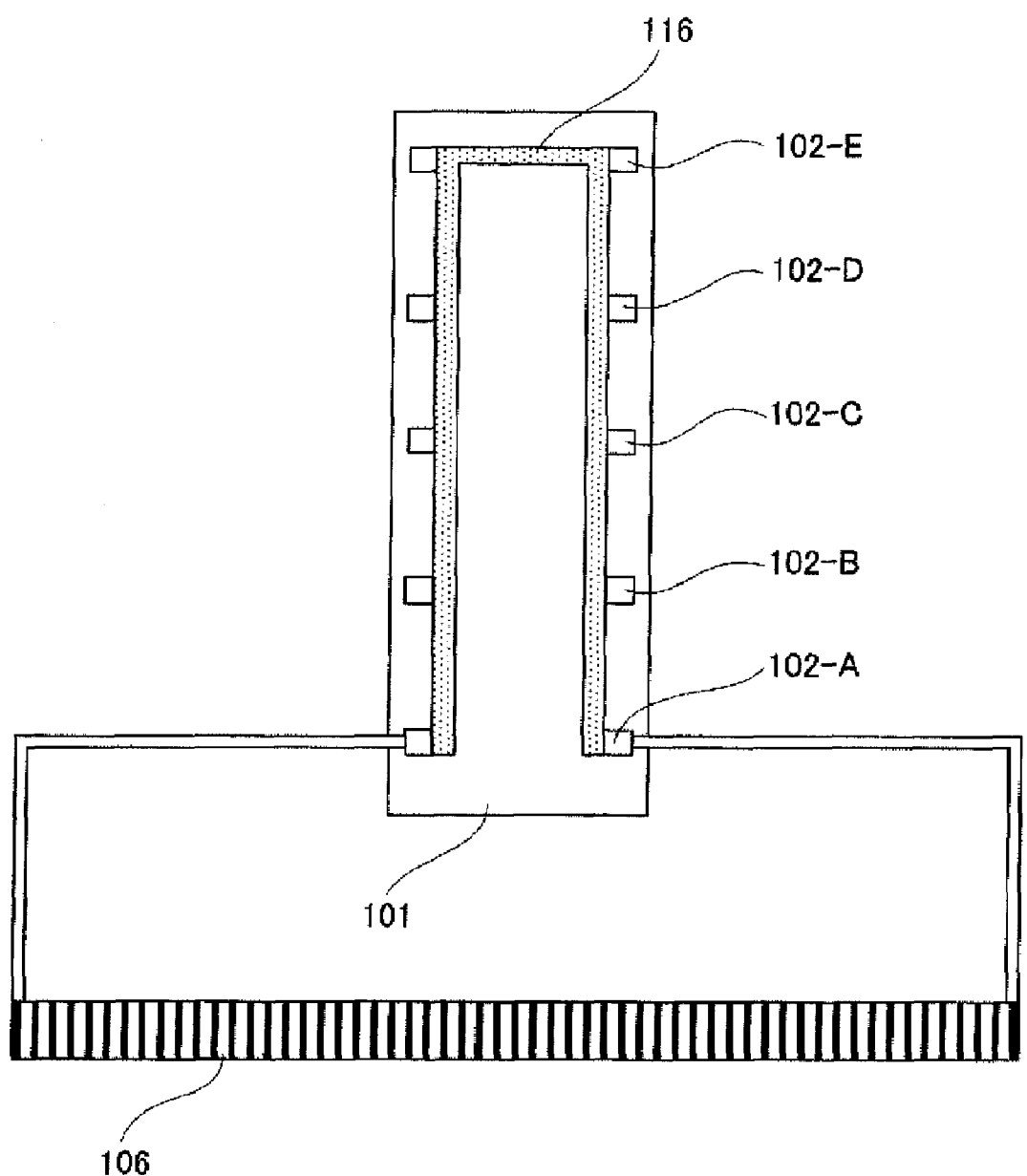
FIG. 5 is a conceptual drawing showing the shape of internal power supply wiring provided inside a flip chip of the semiconductor device according to Embodiment 1 of the present invention and through which one of a power supply potential and a ground potential is transmitted, as well as the positions of bump electrodes connected to the internal power supply wiring.

Now, a description will be given of a method of reducing the impedance of the power supply wiring (internal power supply wiring) inside the flip chip in the semiconductor device configured as described above. FIG. 5 is a conceptual drawing showing the shape of the internal power supply wiring through which one of the power supply potential and the ground potential is transmitted in the flip chip 101, as well as the positions of the bump electrodes connected to the internal power supply wiring. In FIG. 5, reference numeral 116 denotes the internal power supply wiring in the flip chip 101.

The present embodiment has the following configuration. When the internal power supply wiring 116 and bump electrodes 102-A to 102-E are arranged as shown in FIG. 5 and one of the power supply potential, supplied by the connector section 106, and the ground potential is supplied to the bump electrode 102-A, provided in the vicinity of an end of the flip chip 101 located closest to the connector section 106, the one of the power supply potential and the ground potential transmitted via the upper radiator plate 107 is supplied to the bump electrode 102-E, provided in the vicinity of the end of the flip chip 101 located farthest from the connector section 106. This configuration makes it possible to reduce the wiring resistance of the internal power supply wiring 116 to about half, to reduce the impedance, and to uniformly distribute power supply current.

The impedance of the internal power supply wiring 116 can further be reduced by supplying the one of the power supply potential and the ground potential transmitted via the upper radiator plate 107, not only to the bump electrode 102-B but also to the bump electrode 102-C. The impedance of the internal power supply wiring 116 can further be reduced by supplying the one of the power supply potential and the ground potential transmitted via the upper radiator plate 107, not only to the bump electrodes 102-B and 102-C but also to the bump electrodes 102-B and 102-D.

Thus, one of the power supply potential and the ground potential in the internal power supply wiring 116 in the flip chip 101 is enhanced by supplying the one of the power supply potential and the ground potential transmitted via the upper radiator plate 107, to the bump electrode 102-E provided in the vicinity of the end of the flip chip 101 located farthest from the connector section 106. This makes it possible to reduce the impedance of the internal power supply wiring 116 and to uniformly distribute the power supply current.

As described above, Embodiment 1 makes it possible to reduce the impedance of the power supply wiring inside the flip chip 101 and to supply the driving potential (one of the power supply potential and the ground potential) even to the remote end of the flip chip 101. This enables one of the power supply potential and the ground potential to be enhanced in association with multi-pin outputs while improving heat dissipation.

In Embodiment 1, the radiator plate provided over the single-layer wiring board is electrically conductive, so that the upper radiator plate is utilized to supply one of the power supply potential and the ground potential to the flip chip. However, a thermally and electrically conductive radiator plate (lower radiator plate) may be provided under the single-layer wiring board and opposite the flip chip across the single-layer wiring board so as to be in surface contact with the single-layer wiring board. The lower radiator plate may be thus utilized to supply one of the power supply potential and the ground potential to the flip chip. In this case, at least one relay electrode area has only to be formed. Further, in this case, a thermally conductive radiator plate may be provided over the single-layer wiring board.

Embodiment 2

Figure 6:
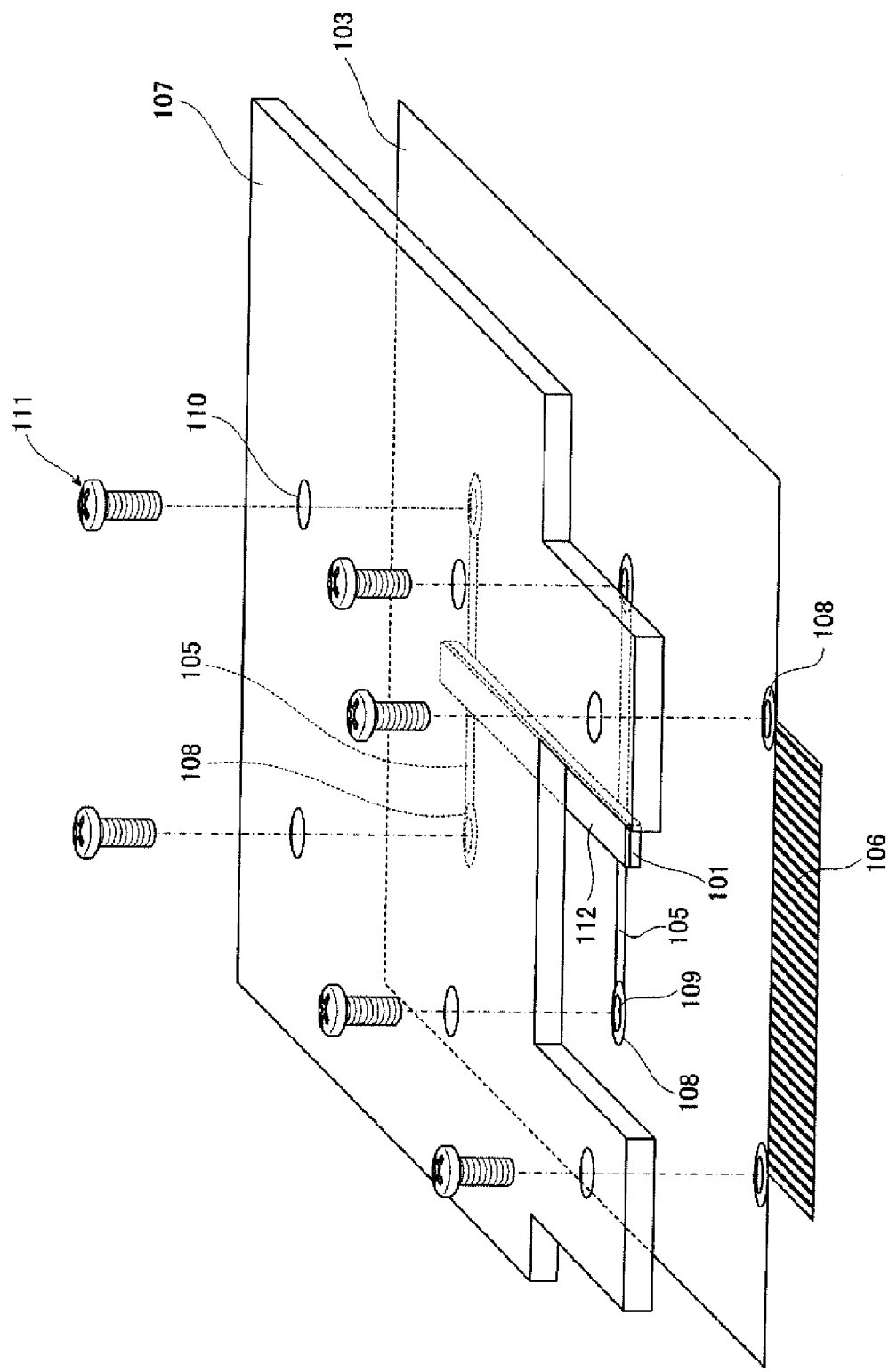
FIG. 6 is an exploded perspective view showing a schematic configuration of a semiconductor device according to Embodiment 2 of the present invention.

Embodiment 2 of the present invention will be described below with reference to the drawings. FIG. 6 is an exploded perspective view showing a schematic configuration of a semiconductor device according to Embodiment 2 of the present invention. The same members as those described above in Embodiment 1 are denoted by the same reference numerals and will not be described.

The semiconductor device is characterized by having the relay electrode areas 108 in the connector section 106 or in the vicinity of the connector section 106, the connector section 106 and the relay electrode areas 108 being directly connected together so that one of the power supply potential and the ground potential is transmitted from the connector section 106 to the relay electrode areas 108 without using any power supply wiring.

That is, for example, as shown in FIG. 6, the relay electrode areas 108 and the board connecting holes 109 are formed in the vicinity of the connector section 106, formed at the end of the single-layer wiring board 103. The relay electrode areas 108 and the upper radiator plate 107 are electrically connected together via the connecting members 111. This configuration allows the upper radiator plate 107 to function as a part of the power supply wiring. This makes it possible to omit the power supply wiring for one of power supply potential supply and ground potential supply which connects the connector section 106 and the flip chip 101 within the single-layer wiring board 103, enabling a reduction in the wiring area in the single-layer wiring board 103.

In the example in FIG. 6, the two relay electrode areas 108 are formed in the vicinity of the connector section 106. However, the present invention is not limited to this. At least one relay electrode area 108 has only to be formed.

In Embodiment 2, the radiator plate provided over the single-layer wiring board is electrically conductive so that the upper radiator plate can be utilized to supply one of the power supply potential and the ground potential to the flip chip. However, a thermally and electrically conductive radiator plate (lower radiator plate) may be provided under single-layer wiring board and opposite the flip chip across the single-layer wiring board so as to be in surface contact with the back surface of the single-layer wiring board. This allows the lower radiator plate to be utilized to supply one of the power supply potential and the ground potential to the flip chip. In this case, a thermally conductive radiator plate may be provided over the single-layer wiring board.

Embodiment 3

Figure 7:
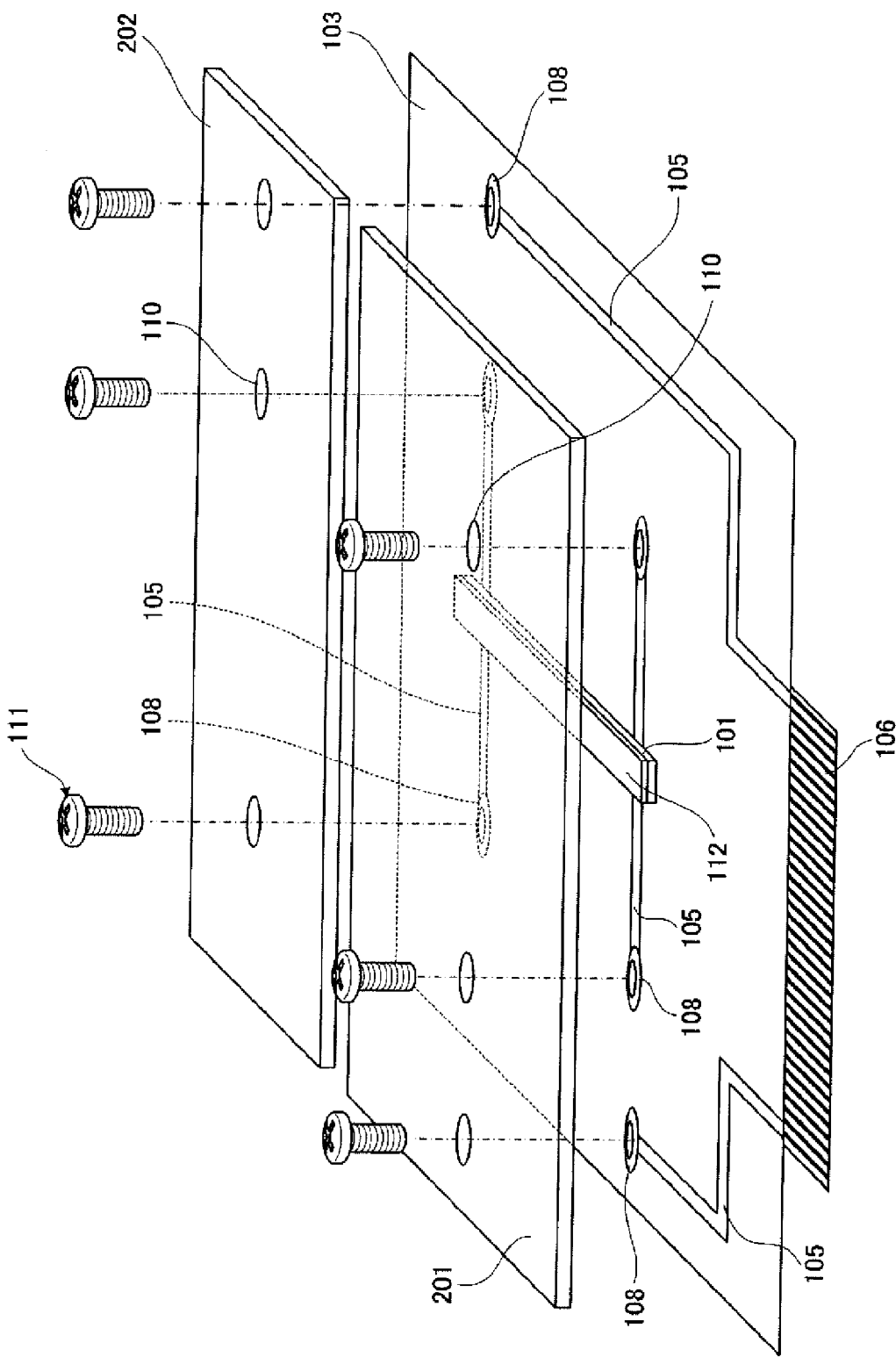
FIG. 7 is an exploded perspective view showing a schematic configuration of a semiconductor device according to Embodiment 3 of the present invention.

Embodiment 3 of the present invention will be described below with reference to the drawings. FIG. 7 is an exploded perspective view showing a schematic configuration of a semiconductor device according to Embodiment 3 of the present invention. The same members as those described above in Embodiments 1 and 2 are denoted by the same reference numerals and will not be described. In FIG. 7, reference numerals 201 and 202 denote a first upper radiator plate and a second upper radiator plate, respectively.

In Embodiments 1 and 2, described above, the one radiator plate is provided over the single-layer wiring board 103 so that one of the power supply potential and the ground potential can be supplied to the flip chip through the radiator plate. However, in Embodiment 3, as shown in FIG. 7, the two upper radiator plates 201 and 202 are provided over the single-layer wiring board 103 so that the power supply potential and the ground potential can be supplied to the flip chip 101 via the radiator plates 201 and 202.

Differences from Embodiments 1 and 2, described above, will be described below in detail, and the detailed description of the same points as those of Embodiments 1 and 2 is omitted. In the description below, the first upper radiator plate 201 is used to transmit the power supply potential, while the second upper radiator plate 202 is used to transmit the ground potential. However, of course, the first upper radiator plate 201 may be used to transmit the ground potential, while the second upper radiator plate 202 may be used to transmit the power supply potential.

As shown in FIG. 7, the electrically and thermally conductive first upper radiator plate 201 and second upper radiator plate 202 are each provided in surface contact with the top surface of the insulating layer 112.

A plurality of the relay electrode areas 108 are formed for each of the first upper radiator plate 201 and the second upper radiator plate 202. The connecting members 111 are arranged between the first upper radiator plate 201 and the relay electrode areas 108 and between the second upper radiator plate 202 and the relay electrode areas 108. The connecting members 111, arranged between both the first and second upper radiator plates 201 and 202 and the single-layer wiring board 103, electrically connect both the first and second upper radiator plates 201 and 202 to the single-layer wiring board 103 (relay electrode areas 108).

The radiator plate connecting holes 110 are formed in each of the first upper radiator plate 201 and the second upper radiator plate 202 at positions corresponding to the board connecting holes 109.

The relay electrode areas 108 are electrically connected to the first power supply wire 105 connected directly to the connector section 106 to transmit the power supply potential and the ground potential. The power supply potential and the ground potential, transmitted through the first power supply wire 105 electrically connected to the relay electrode areas 108, are transmitted via the connecting members 111 to the first upper radiator plate 201 and the second upper radiator plate 202, respectively. The power supply potential and the ground potential transmitted to the first upper radiator plate 201 and the second upper radiator plate 202 are transmitted via the other connecting members 111 to the second power supply wire 105 not connected directly to the connector section 106 on the single-layer wiring board 103. The second power supply wire 105 is connected to the board electrode 104, joined to the bump electrode 102 on the flip chip 101. The flip chip 101 is supplied with the power supply potential and ground potential transmitted through the first upper radiator plate 201 and the second upper radiator plate 202.

Thus, in the single-layer wiring board 103, the power supply potential received by the connector section 106 is transmitted through a path made of the first upper radiator plate 201, the relay electrode area 108, and the connecting member 111, via the board electrode 104 to a first bump electrode 102 on the flip chip 101. Further, the ground potential received by the connector section 106 is transmitted through a path made of the second upper radiator plate 202, the relay electrode area 108, and the connecting member 111, via the board electrode 104 to a second bump electrode 102 on the flip chip 101.

FIG. 7 shows the example in which the three relay electrode areas 108 are formed for each of the first upper radiator plate 201 and the second upper radiator plate 202. However, the present invention is not limited to this. The at least two relay electrode areas 108 have only to be formed for each of the first upper radiator plate 201 and the second upper radiator plate 202.

In the above described example, the power supply potential and the ground potential are supplied through the first power supply wire 105 connected directly to the connector section 106. However, the relay electrode areas 108 may be formed in the connector section 106 or in the vicinity of the connector section 106 as described above in Embodiment 2. Alternatively, the power supply potential and/or the ground potential may be supplied directly to any of the bump electrodes on the flip chip 101 through the first power supply wire 105 connected directly to the connector section 106, as described above in Embodiment 1.

As described above, in the semiconductor device, the two upper radiator plates 201 and 202 are electrically connected to the single-layer wiring board 103 and the flip chip 101. This enables the power supply potential and the ground potential to be supplied to the flip chip 101 through the two upper radiator plates 201 and 202. This in turn makes it possible to enhance both the power supply potential and the ground potential.

In the description of Embodiment 3, the two radiator plates are provided over the single-layer wiring board. However, two thermally and electrically conductive radiator plates (first and second lower radiator plates) may be provided under the single-layer wiring board and opposite the flip chip across the single-layer wiring board so as to be in surface contact with the back surface of the single-layer wiring board. This allows the lower radiator plates to be utilized to supply the power supply potential and the ground potential to the flip chip. In this case, the at least one relay electrode area is formed for each of the two lower radiator plates. Further, a thermally conductive radiator plate may be provided over the single-layer wiring board.

Embodiment 4

Figure 8:
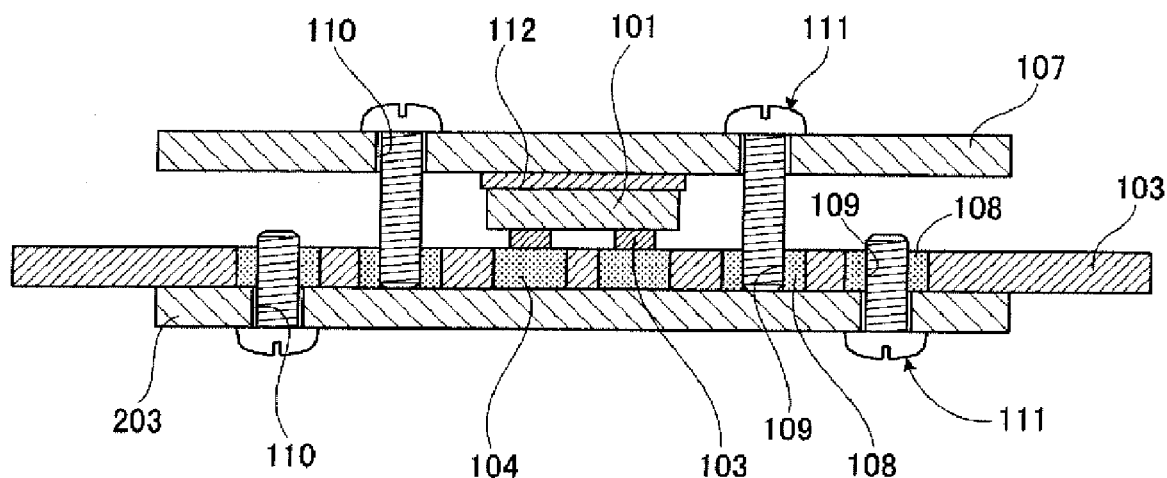
FIG. 8 is an exploded perspective view showing a schematic configuration of a semiconductor device according to Embodiment 4 of the present invention.

Embodiment 4 of the present invention will be described below with reference to the drawings. FIG. 8 is a sectional view showing a schematic configuration of a semiconductor device according to Embodiment 4 of the present invention. The same members as those described above in Embodiments 1 to 3 are denoted by the same reference numerals and will not be described. In FIG. 8, reference numeral 203 denotes a lower radiator plate.

In Embodiment 3, described above, the two radiator plates are provided over the single-layer wiring board 103 to supply the power supply potential and the ground potential to the flip chip through the radiator plates. In Embodiment 4, as shown in FIG. 8, the upper radiator plate 107 is provided over the flip chip 101 and opposite the single-layer wiring board 103 across the flip chip 101. The lower radiator plate 203 is provided under the single-layer wiring board 103 and opposite the flip chip 101 across the single-layer wiring board 103. The power supply potential and the ground potential are supplied to the flip chip 101 through the radiator plates 107 and 203.

Differences from Embodiments 1 to 3, described above, will be described below in detail, and the detailed description of the same points as those of Embodiments 1 to 3 is omitted. In the description below, the upper radiator plate 107 is used to transmit the power supply potential, while the lower radiator plate 203 is used to transmit the ground potential. However, of course, the upper radiator plate 107 may be used to transmit the ground potential, while the lower radiator plate 203 may be used to transmit the power supply potential.

As shown in FIG. 8, the electrically and thermally conductive lower radiator plate 203 is provided in surface contact with the bottom surface of the single-layer wiring board 103.

The at least one relay electrode area 108 is formed for the lower radiator plate 203. The connecting members 111 are also arranged between the lower radiator plate 203 and the relay electrode areas 108. The connecting members 111, arranged between the lower radiator plate 203 and the single-layer wiring board 103, electrically connect the lower radiator plate 203 and the single-layer wiring board 103 (relay electrode areas 108) together.

The radiator plate connecting holes 110 are formed in the lower radiator plate 203 at positions corresponding to the board connecting holes 109.

The relay electrode areas 108 are electrically connected to the first power supply wire 105 connected directly to the connector section 106 to transmit the power supply potential and the ground potential. The power supply potential and the ground potential, transmitted through the first power supply wire 105 electrically connected to the relay electrode areas 108, are transmitted via the connecting members 111 to the upper radiator plate 107 and the lower radiator plate 203. The power supply potential and the ground potential transmitted to the upper radiator plate 107 and the lower radiator plate 203 are transmitted via the other connecting members 111 to the second power supply wire 105 not connected directly to the connector section 106 on the single-layer wiring board 103. The second power supply wire 105 is connected to the board electrode 104, joined to the bump electrode 102 on the flip chip 101. The flip chip 101 is supplied with the power supply potential and ground potential transmitted through the upper radiator plate 107 and the lower radiator plate 203.

Thus, in the single-layer wiring board 103, the power supply potential received by the connector section 106 is transmitted through a path made of the upper radiator plate 107, the relay electrode area 108, and the connecting member 111, via the board electrode 104 to the first bump electrode 102 on the flip chip 101. Further, the ground potential received by the connector section 106 is transmitted through a path made of the lower radiator plate 203, the relay electrode area 108, and the connecting member 111, via the board electrode 104 to the second bump electrode 102 on the flip chip 101.

A plurality of the relay electrode areas 108 are provided for the upper radiator plate 107. The at least one relay electrode area 108 is provided for the lower radiator plate 203.

As described above, in the semiconductor device, the two radiator plates (upper radiator plate 107 and lower radiator plate 203) are electrically connected to the single-layer wiring board 103 and the flip chip 101. This enables the power supply potential and the ground potential to be supplied to the flip chip 101 through the two radiator plates. This in turn makes it possible to enhance both the power supply potential and the ground potential.

Figure 9:
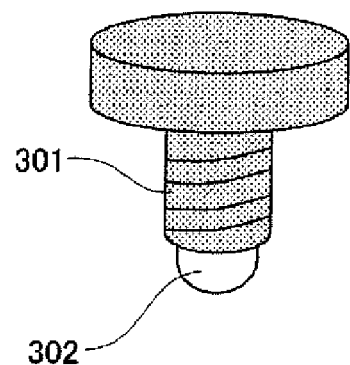
FIG. 9 is a diagram showing an example of a connecting member preferable for the semiconductor device according to Embodiment 4 of the present invention.

In Embodiment 4, the tip portion or surface of the body portion of each connecting member 111 is preferably electrically insulated in order to prevent the upper radiator plate 107 and the lower radiator plate 203 from being short-circuited even if the connecting members 111 electrically connecting the upper radiator plate 107 and the single-layer wiring board 103 together contact the lower radiator plate 203 or the connecting members 111 electrically connecting the lower radiator plate 203 and the single-layer wiring board 103 together contact the upper radiator plate 107. FIG. 9 shows an example of a connecting member preferable for the semiconductor device according to Embodiment 4.

In FIG. 9, reference numerals 301 and 302 denote an electrically conductive portion and an insulating portion, respectively. As shown in FIG. 9, to use the insulating portion 302 to form the tip portion or surface of the body portion of the connecting member 111, it is possible, for example, to construct the surface of the connecting member 111 using an electrically conductive material, to construct the interior of the connecting member 111 using an insulating material, and to expose the interior of the connecting member 111 at the tip of the body portion of the connecting member 111. The connecting member 111 may be a thin, flat member such as an electrically conductive tape provided that the connecting member 111 can establish the above connection relationship.

Embodiment 5

Figure 10:
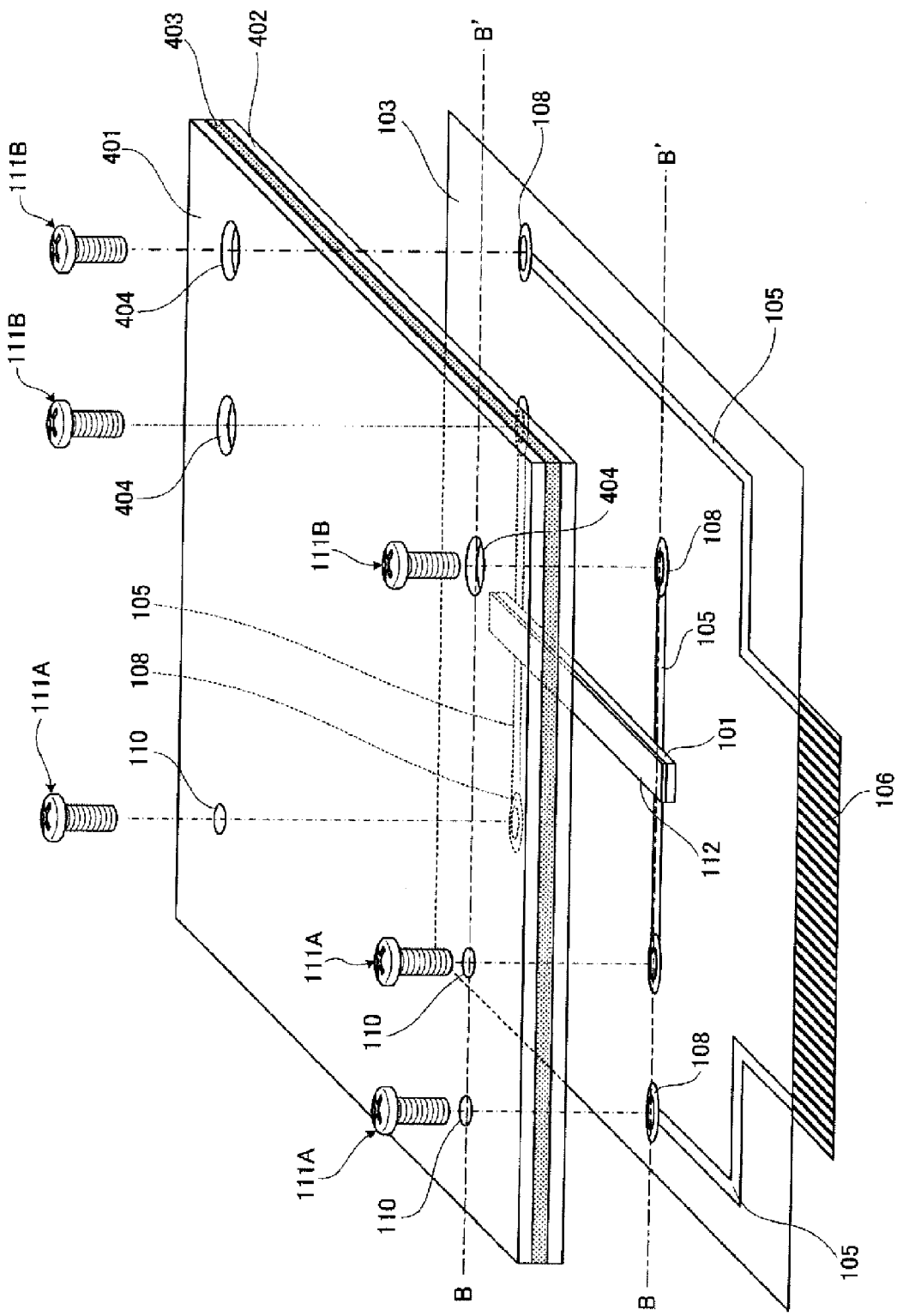
FIG. 10 is an exploded perspective view showing a schematic configuration of a semiconductor device according to Embodiment 5 of the present invention.
Figure 11:
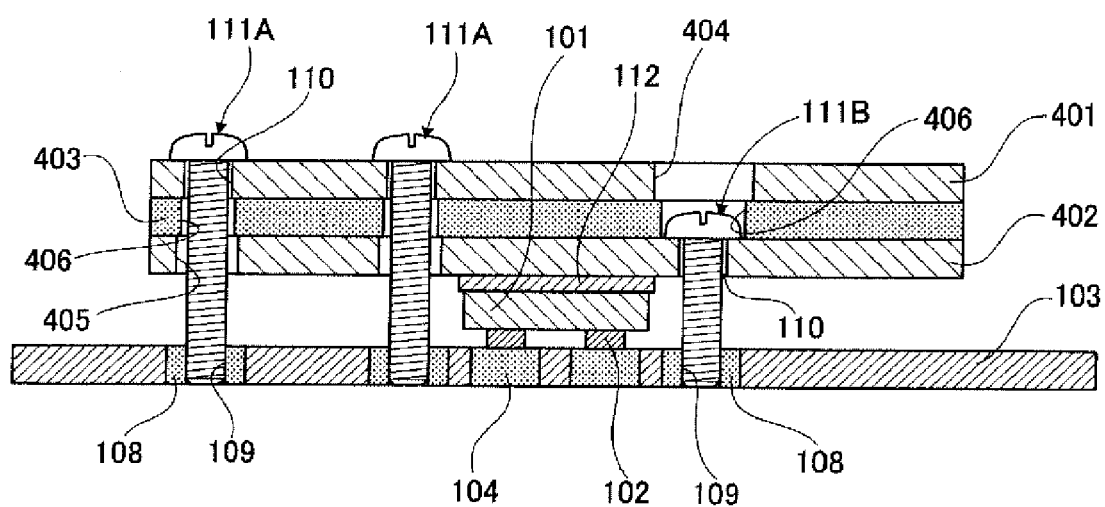
FIG. 11 is an exploded perspective view showing a schematic configuration of the semiconductor device according to Embodiment 5 of the present invention.

Embodiment 5 of the present invention will be described below with reference to the drawings. FIG. 10 is an exploded perspective view showing a schematic configuration of a semiconductor device according to Embodiment 5 of the present invention. FIG. 11 is a sectional view taken along line B-B' in FIG. 10, showing the schematic configuration of the semiconductor device according to Embodiment 5 of the present invention. In FIG. 11, the wiring on the single-layer wiring board is omitted. The same members as those described above in Embodiments 1 to 4 are denoted by the same reference numerals and will not be described.

In FIGS. 10 and 11, reference numerals 401 and 402 denote an upper radiator plate and a lower radiator plate, respectively. Reference numerals 403 and 404 denote a high insulation member (insulating layer) and an upper radiator plate through-hole, respectively. Reference numerals 405 and 406 denote a lower radiator plate through-hole and an insulating layer through-hole, respectively. Reference numeral 111A denotes a connecting member connected to the upper radiator plate. Reference numeral 111B denotes a connecting member connected to the lower radiator plate. Embodiment 5 differs from Embodiments 1 to 4 in that the electrically and thermally conductive upper radiator plate is made of three layers, the upper radiator plate 401, the high insulation member 403, and the lower radiator plate 402 as shown in FIGS. 10 and 11.

The differences from Embodiments 1 to 4, described above, will be described below in detail, and the detailed description of the same points as those of Embodiments 1 to 4 is omitted. In the description below, the upper radiator plate 401 is used to transmit the power supply potential, while the lower radiator plate 402 is used to transmit the ground potential. However, of course, the upper radiator plate 401 may be used to transmit the ground potential, while the lower radiator plate 402 may be used to transmit the power supply potential.

As shown in FIGS. 10 and 11, in the semiconductor device, the electrically and thermally conductive upper radiator plate 401 and lower radiator plate 402 are provided over the flip chip 101 and opposite the single-layer wiring board 103 across the flip chip 101, with the high insulation member 403 located between the upper radiator plate 401 and the lower radiator plate 402. The lower radiator plate 402 is provided in surface contact with the top surface of the insulating layer 112.

A plurality of the relay electrode areas 108 are formed for each of the upper radiator plate 401 and the lower radiator plate 402. Connecting members 111A and 111B are arranged between both the upper radiator plate 401 and lower radiator plate 402 and the relay electrode areas 108. The thus arranged connecting members 11A and 111B electrically connect both the upper radiator plate 401 and lower radiator plate 402 to the single-layer wiring board 103 (relay electrode areas 108).

The relay electrode areas 108 are electrically connected to the first power supply wire 105 connected directly to the connector section 106 to transmit the power supply potential and the ground potential. The power supply potential and the ground potential, transmitted through the first power supply wire 105 electrically connected to the relay electrode areas 108, are transmitted via the connecting members 11A and 111B to the upper radiator plate 401 and the lower radiator plate 402, respectively. The power supply potential and the ground potential transmitted to the upper radiator plate 401 and the lower radiator plate 402 are transmitted via the other connecting members 111A and 111B to the second power supply wire 105 not connected directly to the connector section 106 on the single-layer wiring board 103. The second power supply wire 105 is connected to the board electrode 104, joined to the bump electrode 102 on the flip chip 101. The flip chip 101 is supplied with the power supply potential and ground potential transmitted through the upper radiator plate 401 and the lower radiator plate 402.

Thus, in the single-layer wiring board 103, the power supply potential received by the connector section 106 is transmitted through a path made of the upper radiator plate 401, the relay electrode area 108, and the connecting member 11A, via the board electrode 104 to the first bump electrode 102 on the flip chip 101. Further, the ground potential received by the connector section 106 is transmitted through a path made of the lower radiator plate 402, the relay electrode area 108, and the connecting member 111B, via the board electrode 104 to the second bump electrode 102 on the flip chip 101.

FIG. 10 shows the example in which the three relay electrode areas 108 are formed for each of the upper radiator plate 401 and the lower radiator plate 402. However, the present invention is not limited to this. The at least two relay electrode areas 108 have only to be formed for each of the upper radiator plate 401 and the lower radiator plate 402.

In the above described example, the power supply potential and the ground potential are supplied through the first power supply wire 105 connected directly to the connector section 106. However, the relay electrode areas 108 may be formed in the connector section 106 or in the vicinity of the connector section 106 as described above in Embodiment 2. Alternatively, the power supply potential and/or the ground potential may be supplied directly to any of the bump electrodes on the flip chip 101 through the first power supply wire 105 connected directly to the connector section 106, as described above in Embodiment 1.

As described above, in the semiconductor device, the two radiator plates (upper radiator plate 401 and lower radiator plate 402) are electrically connected to the single-layer wiring board 103 and the flip chip 101. This enables the power supply potential and the ground potential to be supplied to the flip chip 101 through the two radiator plates. This in turn makes it possible to enhance both the power supply potential and the ground potential.

In the description of Embodiment 5, the three radiator plates are provided over the single-layer wiring board. However, three thermally and electrically conductive radiator plates (upper radiator plate, high insulation member, and lower radiator plate) may be provided under the single-layer wiring board and opposite the flip chip across the single-layer wiring board so as to be in surface contact with the back surface of the single-layer wiring board. This allows the power supply potential and the ground potential to be supplied to the flip chip. In this case, the at least one relay electrode area is formed for the upper radiator plate (the radiator plate closer to the single-layer wiring board), whereas the plurality of relay electrode areas are formed for the lower radiator plate (the radiator plate farther from the single-layer wiring board). Further, a thermally conductive radiator plate may be provided over the single-layer wiring board.

Now, with reference to FIG. 11, description will be given of a method for attaching the connecting members to the radiator plate according to Embodiment 5. In Embodiment 5, through-holes 404 to 406 are formed as shown in FIG. 11 so as to prevent the connecting members 111A, electrically connecting the upper radiator plate 401 and the single-layer wiring board 103 together, from contacting the lower radiator plate 402 and to prevent the connecting members 111B, electrically connecting the lower radiator plate 402 and the single-layer wiring board 103 together, from contacting the upper radiator plate 401.

That is, in Embodiment 5, the connecting member 111A, comprising the head portion 113 having the flange portion and the body portion 114, is inserted into the corresponding radiator plate connecting hole 110 in the upper radiator plate 401 from above the upper radiator plate 401. When the connecting member 111A is inserted into the radiator plate connecting hole 110, the head portion 113 is exposed from the top surface of the upper radiator plate 401. A part of the body portion 114 penetrates the insulating layer through-hole 406 and the lower radiator plate through-hole 405 and then projects from the bottom surface of the lower radiator plate 402 into the board connecting hole 109. The thus located connecting member 111A electrically connects the relay electrode area 108 and the upper radiator plate 401 together.

On the other hand, the connecting member 111B, comprising the head portion 113 having the flange portion and the body portion 114, is inserted, from above the upper radiator plate 401, through the upper radiator plate through-hole 404 and the insulating layer through-hole 406 into the corresponding radiator plate connecting hole 110 in the lower radiator plate 402. When the connecting member 111B is inserted into the radiator plate connecting hole 110 in the lower radiator plate 402, the head portion 113 is exposed from the top surface of the lower radiator plate 402. A part of the body portion 114 projects from the bottom surface of the lower radiator plate 402 into the board connecting hole 109. The thus located connecting member 111B electrically connects the relay electrode area 108 and the lower radiator plate 402 together.

Here, the connecting member 111A, connected to the upper radiator plate 401, is inserted so as not to contact the lower radiator plate through-hole 405. The connecting member 111B, connected to the lower radiator plate 402, is inserted so as not to contact the upper radiator plate through-hole 404. Thus, in Embodiment 5, as shown in FIG. 11, the diameter of the lower radiator plate through-hole 405 is larger than that of the connecting member 111A. The diameter of the upper radiator plate through-hole 404 is larger than that of the head portion of the connecting member 11B. For example, a hole made of the lower radiator plate through-hole 405, the insulating layer through-hole 406, and the radiator plate connecting hole 110 in the upper radiator plate 401 may be shaped like a substantial cone so as to have a diameter varying between the upper part and lower part of the entire hole. A hole made of the upper radiator plate through-hole 404, the insulating layer through-hole 406, and the radiator plate connecting hole 110 in the lower radiator plate 402 may be shaped like a substantial cone so as to have a diameter varying between the upper part and lower part of the entire hole.

In this case, the body portion 114 of each of the connecting members 111A and 111B has a circular cross section. However, the sectional shape of the body portion 114 of each of the connecting members 111A and 111B is not limited to a circle. Further, the lower radiator plate through-hole 405 may have a greater sectional size than the body portion 114 of the connecting member 111A. The upper radiator plate through-hole 404 may have a greater sectional size than the head portion 113 of the connecting member 111B.

Furthermore, an insulating layer may be formed on an inner surface of the lower radiator plate through-hole 405, penetrated by the connecting member 111A, and on an inner surface of the upper radiator plate through-hole 404, penetrated by the connecting member 111B. In this case, since the connecting member 111 is made of the head portion 113 and the body portion 114, the corresponding through-hole 404 is formed in the upper radiator plate 401. However, if for example, a conductive tape is used as a connecting member, the tape may be joined to the bottom surface of the lower radiator plate 402. This eliminates the need to form through-holes in the upper radiator plate 401.

Embodiment 6

Figure 12:
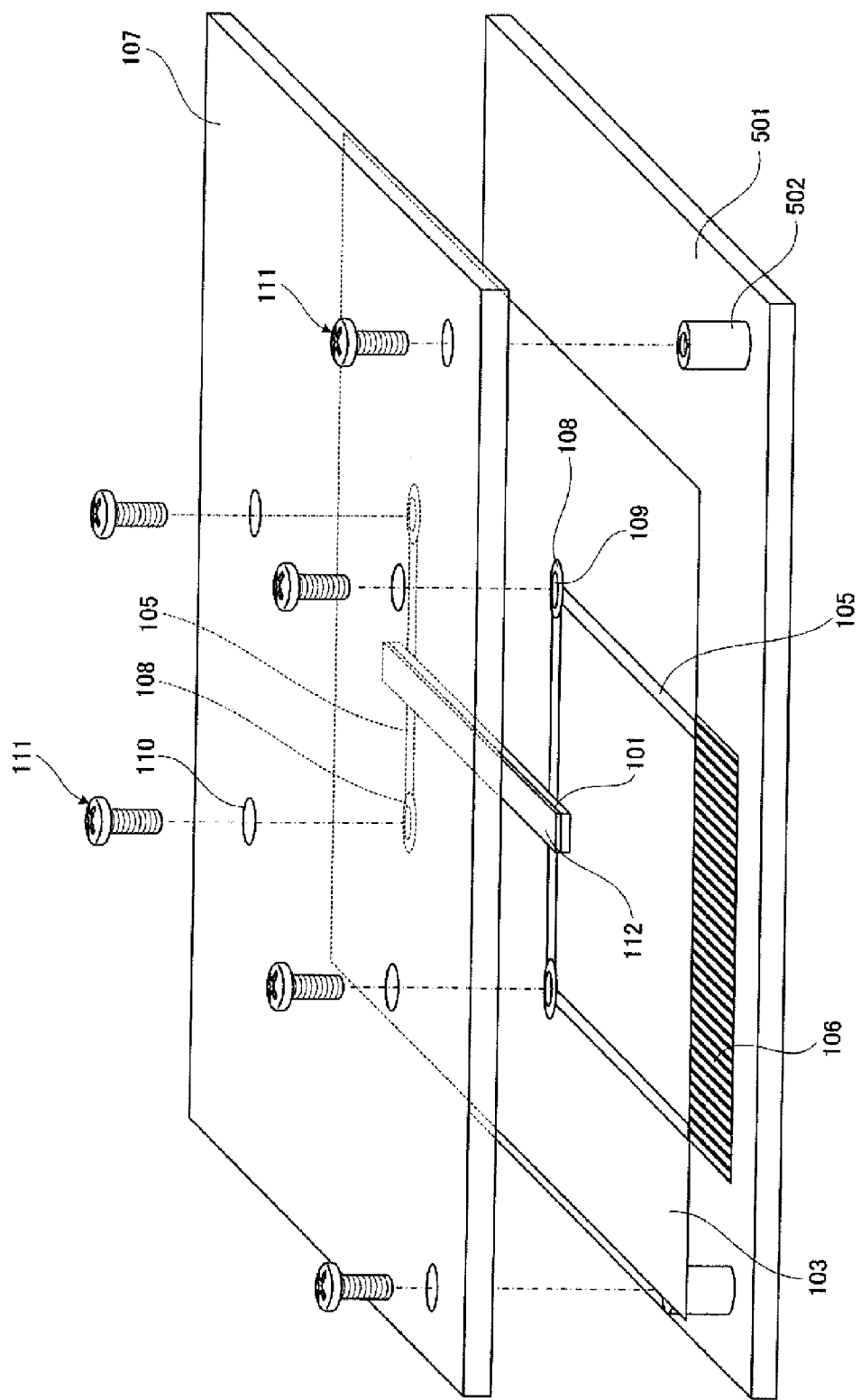
FIG. 12 is an exploded perspective view showing a schematic configuration of a semiconductor device according to Embodiment 6 of the present invention.

Embodiment 6 of the present invention will be described below with reference to the drawings. FIG. 12 is an exploded perspective view showing a schematic configuration of a semiconductor device according to Embodiment 6 of the present invention. The same members as those described above in Embodiments 1 to 5 are denoted by the same reference numerals and will not be described.

In FIG. 12, reference numeral 501 denotes a chassis that is a support plate, and reference numeral 502 denotes a projecting portion provided on the chassis 501. Embodiment 6 differs from Embodiments 1 to 5, described above, in that the chassis 501, originally intended to improve mechanical strength and heat dissipation, is composed of an electrically conductive and highly thermally conductive material and electrically connected to the electrically conductive upper radiator plate 107, so that the chassis 501 can be utilized to enhance one of the power supply potential and the ground potential. The differences from Embodiments 1 to 5 will be described below in detail.

As shown in FIG. 12, the chassis 501, which supports the single-layer wiring board 103 with the flip chip 101 mounted thereon, from below, is provided in surface contact with the back surface of the single-layer wiring board 103. The projecting portions 502 are provided on a top surface of the chassis 501 at positions corresponding to the respective radiator plate connecting holes 110.

The radiator plate connecting holes 110 are formed on the single-layer wiring board 103 not only at positions corresponding to the relay electrode areas 108 (board connecting holes 109) but also at positions corresponding to the projecting portions 502 on the chassis 501. The connecting members 111, arranged between the upper radiator plate 107 and the chassis 501, electrically connect the upper radiator plate 107 and the chassis 501 together. Specifically, the connecting members 111, electrically connecting the upper radiator plate 107 and the chassis 501 together, are inserted, from above the upper radiator plate 107, into respective internal threads formed in the radiator plate connecting holes 110 and the projecting portions 502. A part of the body portion 114 of the connecting member 111 inserted into the internal thread formed in the corresponding projecting portion 502 is threadably engaged with the internal thread of the projecting portion 502.

FIG. 12 shows the example in which the plurality of radiator plate connecting holes 110 and the plurality of projecting portions 502 are formed to electrically connect the upper radiator plate 107 and the chassis 501 together. However, the at least one radiator plate connecting hole 110 and the at least one projecting portion 502 have only to be formed.

As described above, Embodiment 6 enables the chassis 501 and the upper radiator plate 107 to be electrically connected together to enhance one of the power supply potential and the ground potential. Further, one of the power supply potential and the ground potential can be fed from the chassis 501, eliminating the need to feed one of the power supply potential and the ground potential from the connector section 106. This enables a further reduction in the wiring area on the single-layer wiring board 103.

In the above description, the upper radiator plate is electrically connected to the chassis. However, a lower radiator plate may be provided and the chassis may be provided under the lower radiator plate via an insulating layer so that a radiator plate can be composed of three layers, the lower radiator plate, the insulating layer, and the chassis. In this case, the connecting members are mounted as in the case of Embodiment 5, described above.

Embodiment 7

Figure 13:
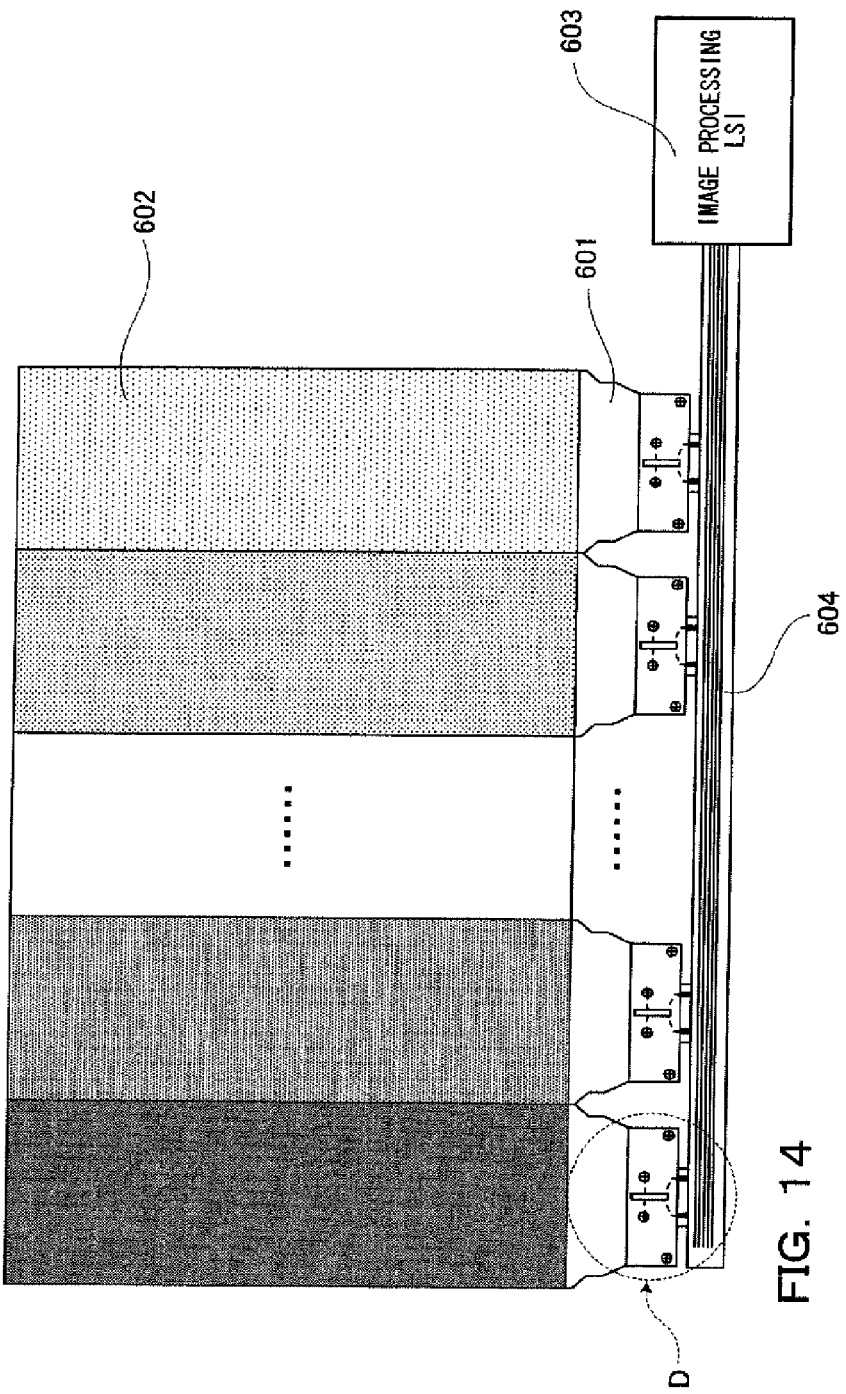
FIG. 13 is a diagram showing a schematic configuration of a display apparatus according to Embodiment 7 of the present invention.
Figure 14:
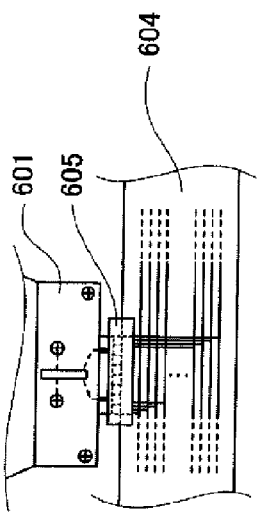
FIG. 14 is an enlarged diagram of a portion shown by reference character D in FIG. 13.
Figure 15:
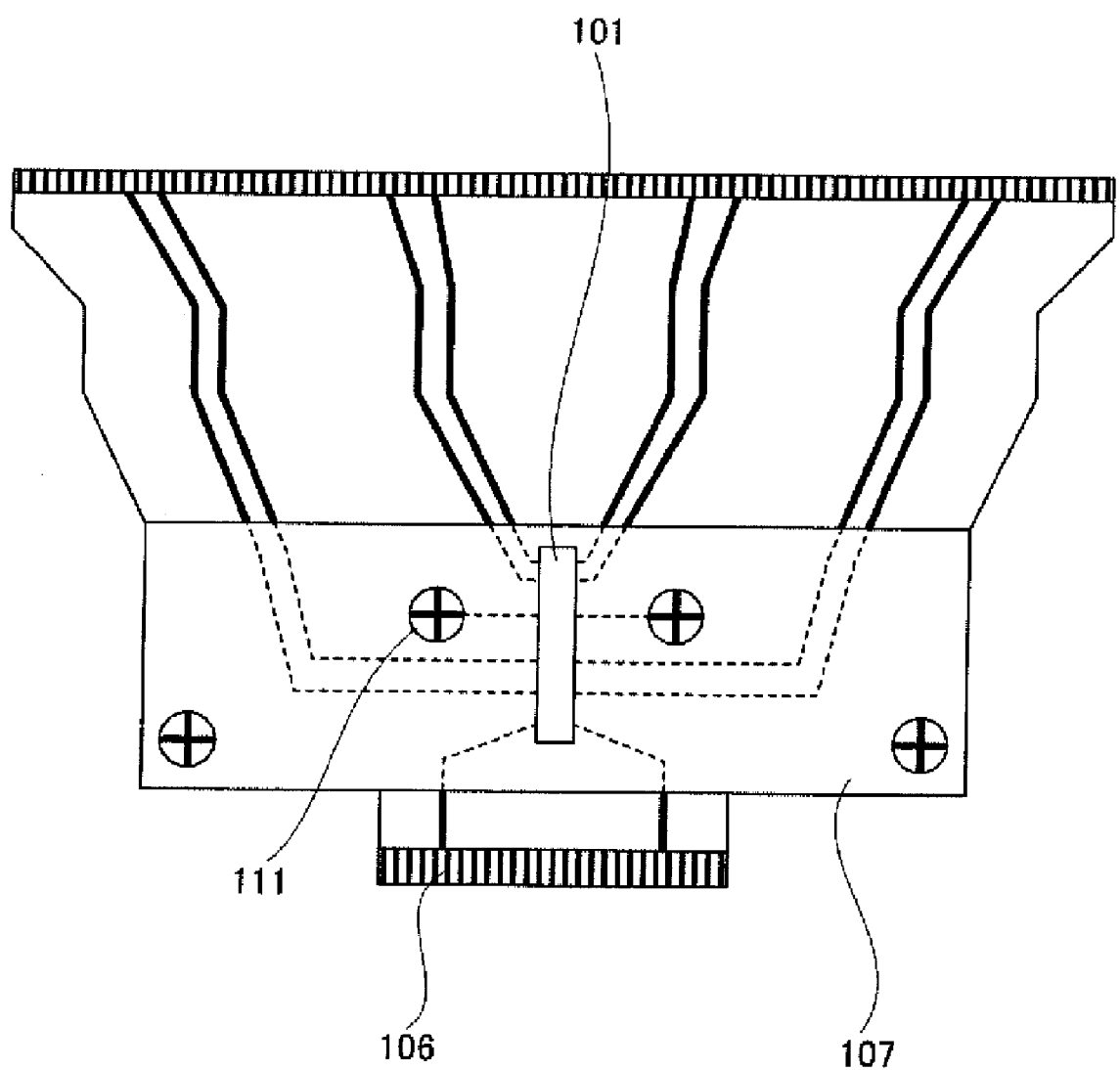
FIG. 15 is a diagram showing a schematic configuration of a modularized semiconductor device used in the display apparatus according to Embodiment 7 of the present invention.

A display apparatus according to Embodiment 7 of the present invention will be described below with reference to the drawings. FIG. 13 is a diagram showing a schematic configuration of the display apparatus according to Embodiment 7 of the present invention. FIG. 14 is an enlarged diagram of a portion shown by reference character D in FIG. 13. FIG. 15 is a diagram showing a schematic configuration of a modularized semiconductor device used in the display apparatus according to Embodiment 7 of the present invention.

The same members as those described above in Embodiments 1 to 6 are denoted by the same reference numerals and will not be described.

In FIGS. 13 and 14, reference numerals 601 and 602 denote a semiconductor device and a display panel, respectively. Reference numerals 603, 604, and 605 denote an image processing LSI (image processing section), a common wiring board, and a connector, respectively. The semiconductor device 601 is modularized on the basis of a structure described in any of Embodiments 1 to 6, described above. The display apparatus uses a plurality of the semiconductor devices 601 each driving one pixel column block for display, to drive a large screen panel (display panel 602) in which pixels are arranged in a matrix.

The image processing LSI 603 generates external signals such as display data, display data control signals, the power supply potential, and the ground potential which are required to operate the flip chip (semiconductor element) 101 contained in each of the semiconductor devices 601. The image processing LSI 603 controls display on the display panel 602.

The common wiring board 604 transmits the external signal generated by the image processing LSI 603 to the connector section 106 of each semiconductor device 601. The common wiring board 604 has the connectors 605 for the respective semiconductor devices 601. Each semiconductor device 601 is electrically and mechanically connected to the connector 605, provided on the common wiring board 604, via the connector section 106 to receive the external signal. The semiconductor device 601 thus drives the corresponding pixel column block in the display panel 602 for display.

As shown in FIG. 13, a plurality of pixel column blocks can be constructed using the plurality of semiconductor devices 601. Electrically connecting each semiconductor device 601 to the common wiring board 604 makes it possible to transmit signals provided by the image processing LSI 1603 to control the display on the panel, to the semiconductor device 601. This configuration enables the implementation of a display apparatus that is able to output, to the display panel 602, display data corresponding to pixel columns for a desired screen size.

By using the plurality of semiconductor devices 601 modularized on the basis of any of the structures described above in Embodiments 1 to 6, it is possible to enhance the power supply potential and the ground potential while reducing costs and ensuring heat dissipation. This also allows the use of a larger screen.

Figure 16:
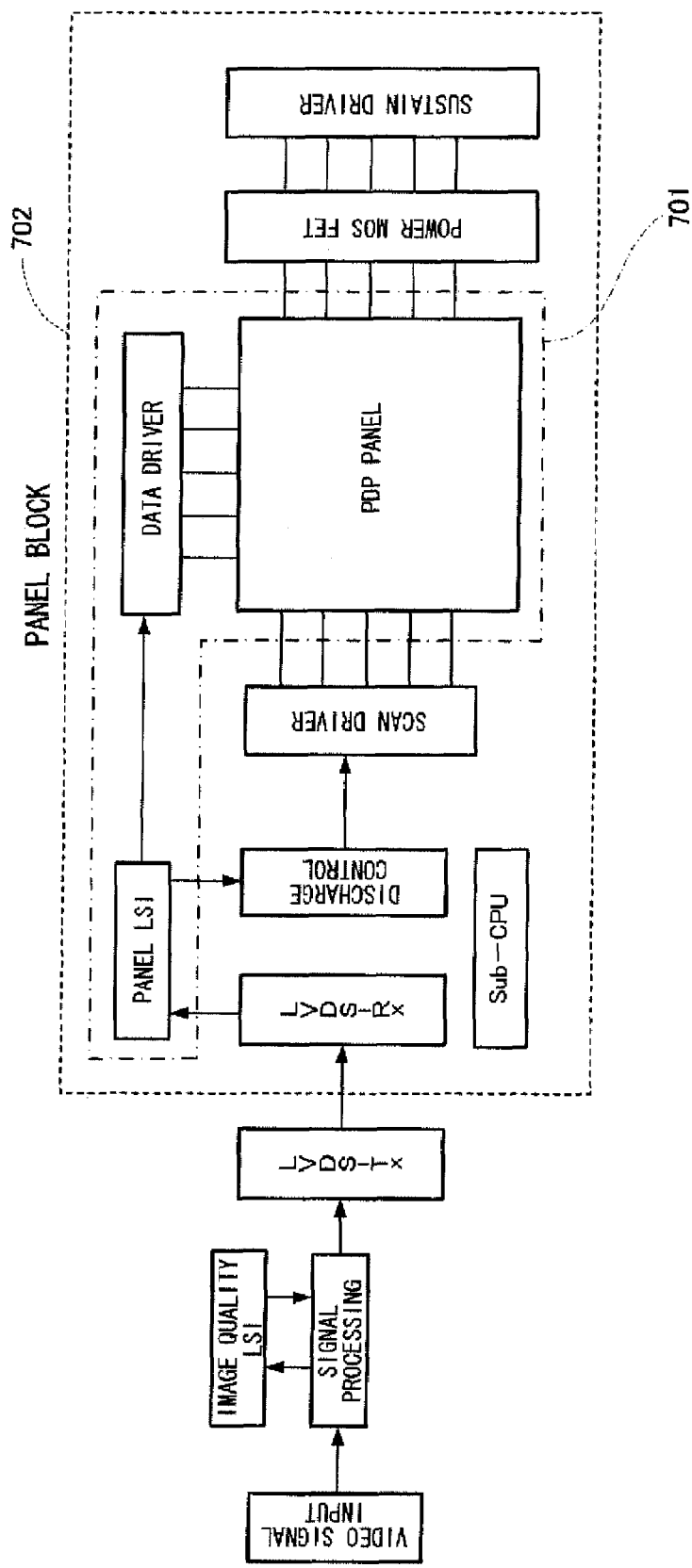
FIG. 16 is a diagram of the system configuration of a PDP television to which the display apparatus according to Embodiment 7 of the present invention is applied by incorporation.

FIG. 16 is a diagram showing the system configuration of a PDP television in which the display apparatus is applied by incorporation. In FIG. 16, reference numeral 701 denotes a display apparatus, and reference numeral 702 denotes a PDP panel block as a video display system including the display apparatus 701. As shown in FIG. 16, the display apparatus 701 can be easily incorporated into the video display system. This enables the power supply potential and the ground potential to be enhanced while maintaining appropriate heat dissipation.

Embodiment 8

Figure 17:
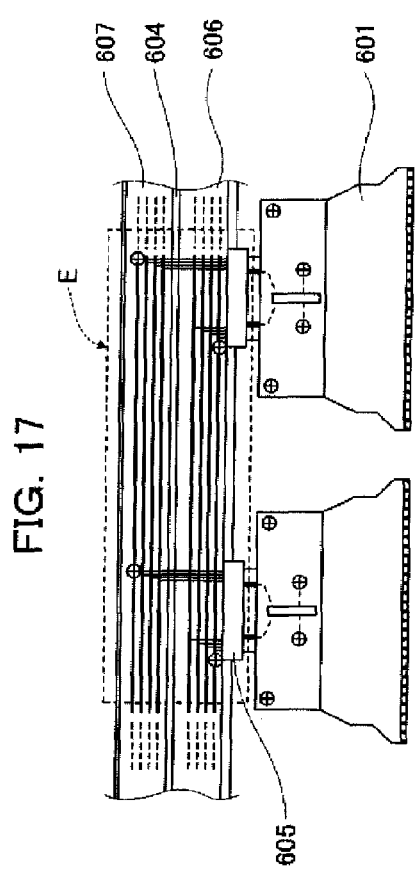
FIG. 17 is a diagram showing a schematic configuration of a display apparatus according to Embodiment 8 of the present invention.
Figure 18:
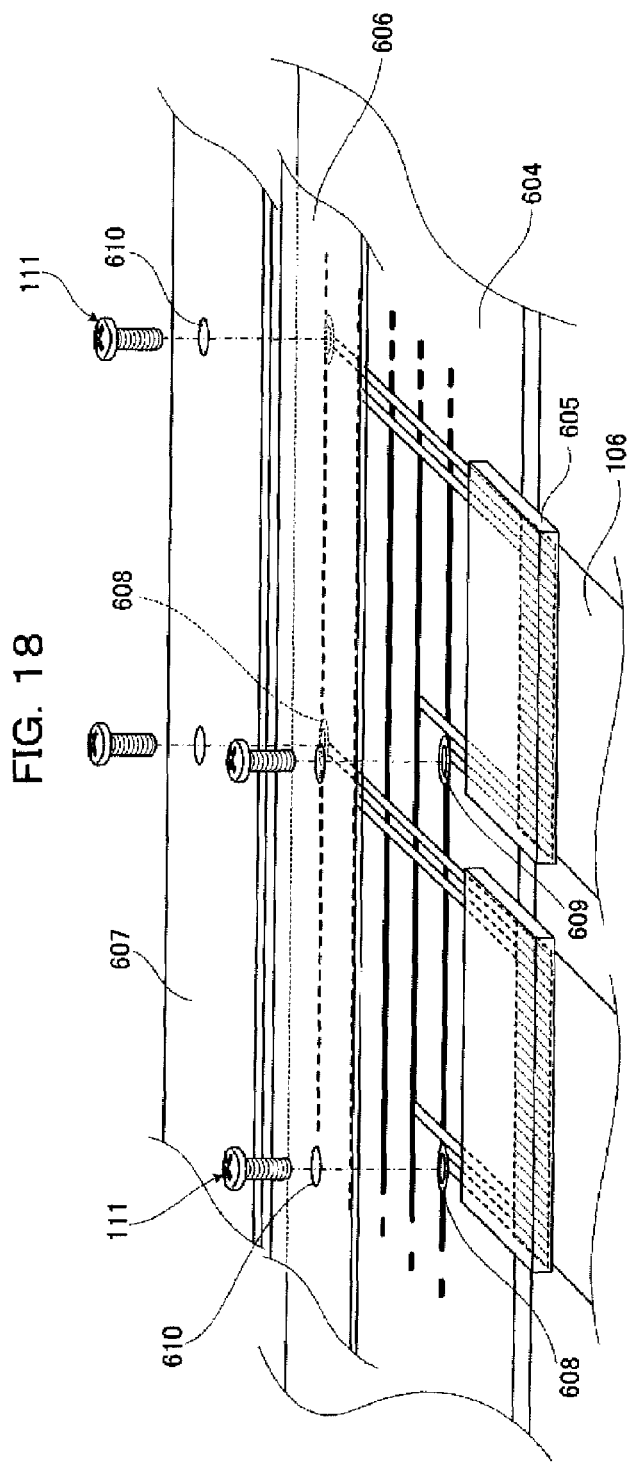
FIG. 18 is an enlarged diagram of a portion shown by reference character E in FIG. 17.

A display apparatus according to Embodiment 8 of the present invention will be described below with reference to the drawings. FIG. 17 is a diagram showing a schematic configuration of a display apparatus according to Embodiment 8 of the present invention. FIG. 18 is an enlarged diagram of a portion shown by reference character E in FIG. 17.

The same members as those described above in Embodiments 1 to 7 are denoted by the same reference numerals and will not be described.

In FIGS. 17 and 18, reference numerals 606 and 607 denote a first upper long radiator plate (radiator plate) and a second upper long radiator plate (radiator plate). Reference numeral 608 denotes a relay electrode area formed on the common wiring board 604. Reference numeral 609 denotes a board connecting hole formed in the relay electrode area 608. Reference numeral 610 denotes a radiator plate connecting hole formed in the first upper long radiator plate 606 and second upper long radiator plate 607. In the description below, the first upper long radiator plate 606 is used to transmit the power supply potential, while the second upper long radiator plate 607 is used to transmit the ground potential. However, of course, the first upper long radiator plate 606 may be used to transmit the ground potential, while the second upper long radiator plate 607 may be used to transmit the power supply potential.

In Embodiment 8, any of the configurations described above in Embodiments 1 to 6 is applied to the common wiring board 604. That is, as shown in FIGS. 17 and 18, the electrically and thermally conductive first and second upper long radiator plates 606 and 607 are provided over the common wiring board 604.

The relay electrode areas 608, electrically connected to the power supply wiring on the common wiring board 604, are formed in the middle of the power supply wiring. The relay electrode areas 608 are electrically connected to the common wiring board 604, through which the power supply potential and ground potential from the image processing LSI 603 are transmitted.

The radiator plate connecting holes 610 are formed in each of the first and second upper long radiator plates 606 and 607 at positions corresponding to the relay electrode areas 608. The board connecting holes 609 is formed in each of the relay electrode areas 608.

In Embodiment 8, the connecting members 111, described above in Embodiments 1 to 6, are used to electrically connect both the first and second upper long radiator plates 606 and 607 to the common wiring board 604. The connecting members 111 are arranged between both the first and second upper long radiator plates 606 and 607 and the relay electrode areas 608. The connecting members 111, arranged between both the first and second upper long radiator plates 606 and 607 and the relay electrode areas 608, electrically connect both the first and second upper long radiator plates 606 and 607 to the relay electrode areas 608. Specifically, as is the case with Embodiments 1 to 6, described above, each of the connecting members 111 is inserted into the corresponding radiator plate connecting hole 610 and board connecting hole 609 from above the first and second upper long radiator plates 606 and 607. A part of the body portion of the connecting member 111 inserted into the board connecting hole 609 is threadably engaged with the board connecting hole 609.

In the above configuration, each of the power supply potential and the ground potential is transmitted to the first and second upper long radiator plates 606 and 607 via the connecting members 111. The power supply potential and ground potential transmitted to the first and second upper long radiator plates 606 and 607 are each supplied to the power supply wiring on the common wiring board 604 via the other connecting members 111.

In the description of Embodiment 8, the two long radiator plates are provided over the common wiring board. However, the two long radiator plates (radiator plates) may both be provided under the common wiring board or may be provided over and under the common wiring board, respectively. Alternatively, the three long radiator plates (radiator plates) may be provided over or under the common wiring board as described in Embodiment 5. The at least two relay electrode areas 608 have only to be formed for each of the first and second upper long radiator plates 606 and 607.

As described above, the electrically conductive radiator plates are provided for and electrically connected to the common wiring board. This further improves the heat dissipation, the power supply potential, and the ground potential.

The invention claimed is:

1. A semiconductor device comprising:
a wiring board including a single conductive layer;
a semiconductor element mounted on the wiring board;
an element electrode provided on the semiconductor element;
a board electrode provided in the wiring board and electrically connected to the element electrode;
a connector section provided at an end of the wiring board to receive an external signal containing a first potential and a second potential to drive the semiconductor element;
at least one electrically and thermally conductive radiator plate located adjacent to the semiconductor device for dissipating heat from the semiconductor device, and used to transmit the first potential and/or the second potential
at least one relay electrode section provided in the wiring board; and
at least one connecting member located between the radiator plate and the relay electrode section to electrically connect the radiator plate and the relay electrode section together,
wherein the wiring board is structured so that the first potential and/or the second potential received by the connector section is transmitted through a path comprising the radiator plate, the relay electrode section, the connecting member, and the board electrode to the element electrode on the semiconductor element.

2. The semiconductor device according to claim 1, wherein the first potential is one of a power supply potential and a ground potential of the semiconductor element, and the second potential is the other of the power supply potential and the ground potential of the semiconductor element.

3. The semiconductor device according to claim 1, wherein the connecting member comprises a head portion having a flange portion, and a body portion, and the connecting member is located so that the head portion is exposed from one surface of the radiator plate and so that a part of the body portion projects from the other surface of the radiator plate and connects to the relay electrode section, and
an electrically conductive connection holding member is provided between the flange portion of the connecting member and the one surface of the radiator plate to support the flange portion.

4. The semiconductor device according to claim 1, wherein the external shape of the semiconductor element comprises two short sides and two long sides, and one of the short sides is located closer to the connector section, while the other of the short sides is located farther from the connector section.

5. The semiconductor device according to claim 1, wherein the at least one element electrode to which the first potential and/or the second potential is transmitted through the radiator plate is provided in the vicinity of an end of the semiconductor element located farthest from the connector section.

6. The semiconductor device according to claim 1, wherein the at least one relay electrode section is provided in the connector section or in the vicinity of the connector section and connected to the connector section.

7. The semiconductor device according to claim 1, wherein the radiator plate is located over the semiconductor element and opposite the wiring board across the semiconductor element, for transmitting heat from the semiconductor element to the radiator plate.

8. The semiconductor device according to claim 7, wherein the radiator plate comprises a first upper radiator plate and a second upper radiator plate,
a plurality of the relay electrode sections are provided for each of the first upper radiator plate and the second upper radiator plate,
one of the first potential and the second potential is transmitted to the first upper radiator plate via the connecting member, and
the other of the first potential and the second potential is transmitted to the second upper radiator plate via the connecting member.

9. The semiconductor device according to claim 1, wherein the radiator plate comprises an upper radiator plate provided over the semiconductor element and opposite the single-layer wiring board across the semiconductor element and a lower radiator plate provided under the single-layer wiring board and opposite the semiconductor element across the single-layer wiring board,
a plurality of the relay electrode sections are provided for the upper radiator plate, and the at least one relay electrode is provided for the lower radiator plate,
one of the first potential and the second potential is transmitted to the upper radiator plate via the connecting member, and
the other of the first potential and the second potential is transmitted to the lower radiator plate via the connecting member.

10. The semiconductor device according to claim 9, wherein one of a tip portion and a tip surface of the connecting member which is located closer to the single-layer wiring board is electrically insulated.

11. The semiconductor device according to claim 1, wherein the radiator plate is located under the single-layer wiring board and opposite the semiconductor element across the single-layer wiring board.

12. The semiconductor device according to claim 11, wherein the radiator plate comprises a first lower radiator plate and a second lower radiator plate,
the at least one relay electrode section is provided for each of the first lower radiator plate and the second lower radiator plate,
one of the first potential and the second potential is transmitted to the first lower radiator plate via the connecting member, and
the other of the first potential and the second potential is transmitted to the second lower radiator plate via the connecting member.

13. The semiconductor device according to claim 1, wherein the radiator plate is provided over the semiconductor element and opposite the single-layer wiring board across the semiconductor element and comprises three layers, a lower radiator plate, an insulating layer, and an upper radiator plate,
a plurality of through-holes into each of which the connecting member connected to the upper radiator plate is inserted are formed in each of the lower radiator plate and the insulating layer,
a plurality of the relay electrode sections are provided for each of the upper radiator plate and the lower radiator plate, one of the first potential and the second potential is transmitted to the upper radiator plate via the connecting member, and the other of the first potential and the second potential is transmitted to the lower radiator plate via the connecting member.

14. The semiconductor device according to claim 13, wherein the connecting member is inserted into the through-hole so as not to contact the lower radiator plate.

15. The semiconductor device according to claim 13, wherein each of the through-holes has a size varying between a portion corresponding to the lower radiator plate and a portion corresponding to the insulating layer.

16. The semiconductor device according to claim 1, wherein the radiator plate is provided under the single-layer wiring board and opposite the semiconductor element across the single-layer wiring board and comprises three layers, a lower radiator plate, an insulating layer, and an upper radiator plate, a plurality of through-holes into each of which the connecting member connected to the lower radiator plate is inserted are formed in each of the upper radiator plate and the insulating layer, the at least one relay electrode section is provided for the upper radiator plate, and a plurality of the relay electrode sections are provided for the lower radiator plate, one of the first potential and the second potential is transmitted to the upper radiator plate via the connecting member, and the other of the first potential and the second potential is transmitted to the lower radiator plate via the connecting member.

17. The semiconductor device according to claim 16, wherein the connecting member is inserted into the through-hole so as not to contact the upper radiator plate.

18. The semiconductor device according to claim 16, wherein each of the through-holes has a size varying between a portion corresponding to the upper radiator plate and a portion corresponding to the insulating layer.

19. The semiconductor device according to the claim 1, further comprising an electrically conductive support plate that supports the single-layer wiring board with the semiconductor element mounted thereon, from below the single-layer wiring board, the connecting member also being located between the radiator plate and the support plate to connect electrically the radiator plate and support plate together, one of the first potential and the second potential being transmitted to the support plate via the connecting member.

20. A display apparatus comprising:

a plurality of the semiconductor devices according to claim 1;

a display panel in which pixels are arranged in a matrix;

an image processing section that generates an external signal containing a first potential and a second potential required to drive a semiconductor element contained in each of the semiconductor devices; and a common wiring board that transmits the external signal generated by the image processing section, each of the semiconductor devices being connected to the common wiring board via a connector section provided on the semiconductor device to receive the external signal to drive a corresponding pixel column block for display.

21. The display apparatus according to claim 20, further comprising:

at least one electrically and thermally conductive radiator plate located over and/or under the common wiring board and used to transmit the first potential and/or the second potential;

a plurality of relay electrode sections provided in the common wiring board to connect electrically to a part of wiring on the common wiring board through which the first potential and/or the second potential is transmitted; and a plurality of electrically conductive connecting members arranged between the radiator plate provided for the common wiring board and the relay electrode sections provided on the common wiring board to electrically connect the radiator plate provided for the common wiring board to the relay electrode sections provided on the common wiring board.

* * * * *